(12) United States Patent
Nelson et al.

(10) Patent No.: US 9,799,752 B1
(45) Date of Patent: Oct. 24, 2017

(54) METHOD FOR FORMING A THIN-FILM TRANSISTOR

(71) Applicant: Eastman Kodak Company, Rochester, NY (US)

(72) Inventors: Shelby Forrester Nelson, Pittsford, NY (US); Carolyn Rae Ellinger, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 0 days.

(21) Appl. No.: 15/338,576

(22) Filed: Oct. 31, 2016

(51) Int. Cl.
| | |
|---|---|
| *H01L 21/00* | (2006.01) |
| *H01L 29/66* | (2006.01) |
| *H01L 29/40* | (2006.01) |
| *H01L 21/285* | (2006.01) |
| *H01L 21/3065* | (2006.01) |
| *H01L 29/423* | (2006.01) |
| *H01L 29/417* | (2006.01) |

(52) U.S. Cl.
CPC .. *H01L 29/66742* (2013.01); *H01L 21/28556* (2013.01); *H01L 21/3065* (2013.01); *H01L 29/401* (2013.01); *H01L 29/41733* (2013.01); *H01L 29/42384* (2013.01)

(58) Field of Classification Search
None
See application file for complete search history.

(56) References Cited

U.S. PATENT DOCUMENTS

| | | | |
|---|---|---|---|
| 5,418,393 A | * | 5/1995 | Hayden ............ H01L 29/42384 257/347 |
| 7,235,856 B1 | | 6/2007 | Moore et al. |
| 7,413,982 B2 | | 8/2008 | Levy |
| 7,456,429 B2 | | 11/2008 | Levy |
| 7,571,529 B2 | | 8/2009 | Sirringhaus et al. |
| 7,572,651 B2 | | 8/2009 | Sirringhaus et al. |
| 7,732,329 B2 | | 6/2010 | Vasilev |

(Continued)

OTHER PUBLICATIONS

Dodabalapur et al., "Organic Transistors Two Dimensional Transport and Improved Electrical Characteristics", *Science*, Apr. 1995, pp. 270-271.

(Continued)

*Primary Examiner* — Reema Patel
(74) *Attorney, Agent, or Firm* — Kevin E. Spaulding

(57) ABSTRACT

A method of forming a thin-film transistor includes providing a substrate having a top surface and a recess in the top surface. An electrically conductive gate is provided within the recess. A conformal insulating material layer and a conformal semiconductor material layer are formed in the recess, with the semiconductor material layer extending over the top surface of the substrate outside of the recess. Source and drain electrodes are formed by adding a deposition inhibitor material on a portion of the substrate including within the recess; and depositing a thin-film of electrically conductive material, wherein the deposition inhibitor material inhibits the deposition of the electrically conductive material such that the electrically conductive material is patterned by the deposition inhibitor material during deposition, wherein the patterned electrically conductive material provides the source electrode on a first side of the recess and the drain electrode on a second side of the recess.

20 Claims, 19 Drawing Sheets

(56) References Cited

U.S. PATENT DOCUMENTS

| | | |
|---|---|---|
| 7,789,961 B2 | 9/2010 | Nelson et al. |
| 8,012,875 B2 | 9/2011 | Vasilev |
| 8,080,152 B2 | 12/2011 | Sirringhaus |
| 8,173,538 B2 | 5/2012 | Feustel et al. |
| 8,653,516 B1 | 2/2014 | Nelson et al. |
| 8,791,023 B2 | 7/2014 | Ellinger et al. |
| 8,846,545 B2 | 9/2014 | Ellinger et al. |
| 8,927,434 B2 | 1/2015 | Ellinger et al. |
| 2009/0130858 A1 | 5/2009 | Levy |
| 2010/0301337 A1 | 12/2010 | Rider et al. |
| 2011/0159250 A1 | 6/2011 | Rider et al. |
| 2014/0061648 A1 | 3/2014 | Levy et al. |
| 2014/0061795 A1 | 3/2014 | Levy et al. |
| 2014/0061869 A1 | 3/2014 | Nelson et al. |
| 2014/0065838 A1 | 3/2014 | Ellinger et al. |

OTHER PUBLICATIONS

Sze, "Physics of Semiconductor Devices", *Semiconductor Devices-Physics and Technology*, John Wiley & Sons, 1981, pp. 438-443.
Sinha, A. et al., *Journal of Science and Technology B*, vol. 24, No. 6, Nov./Dec. 2006, pp. 2523-2532.

\* cited by examiner

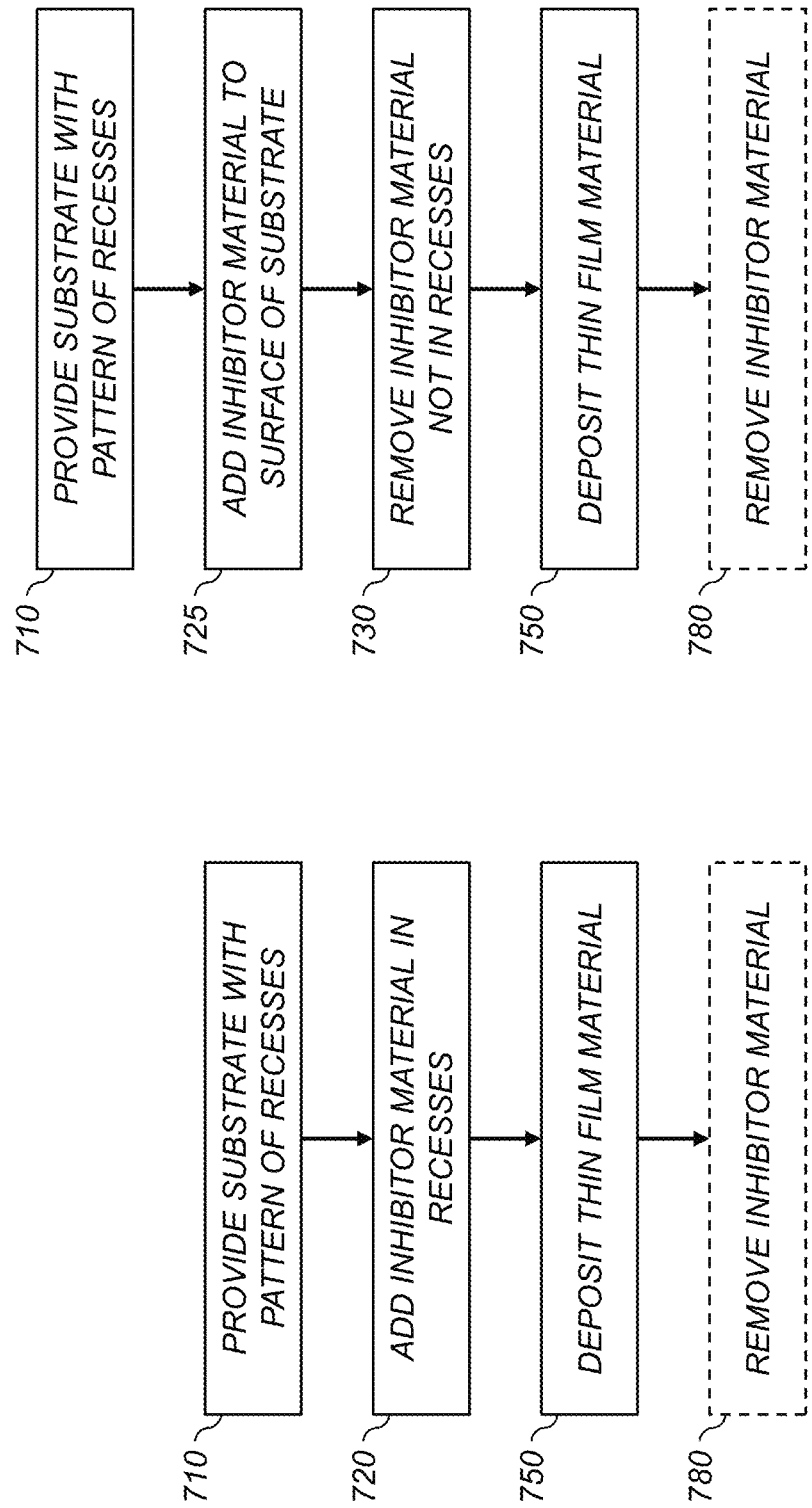

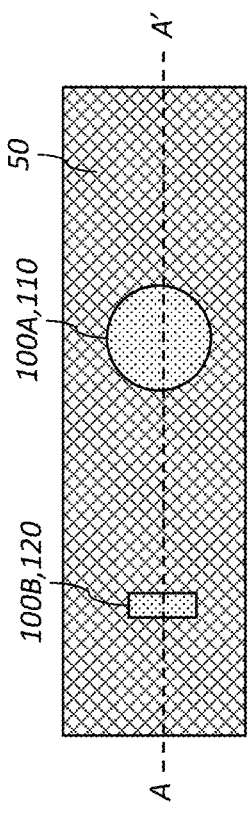
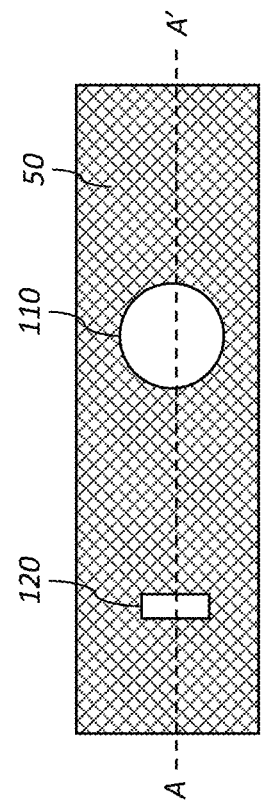
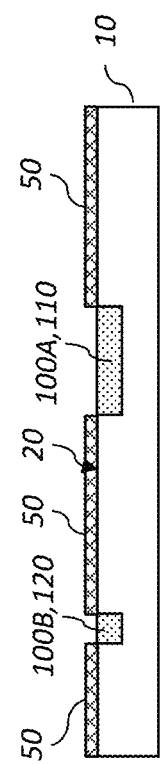
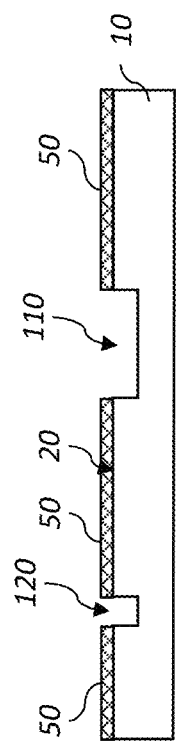

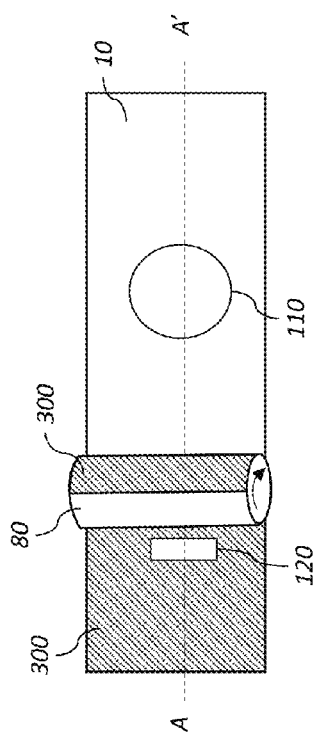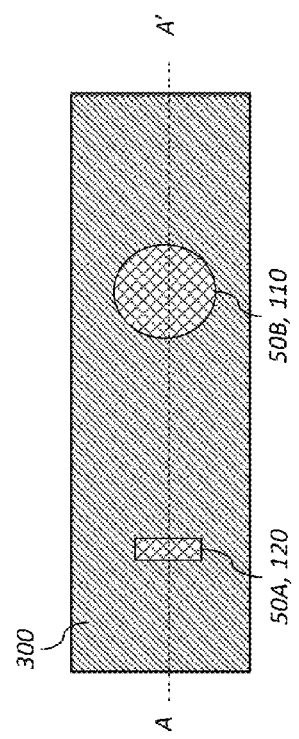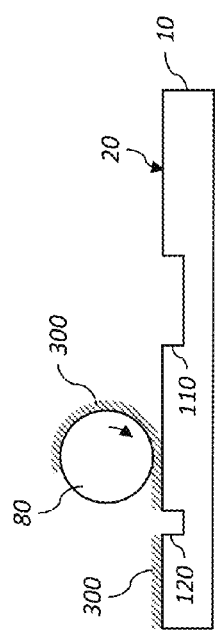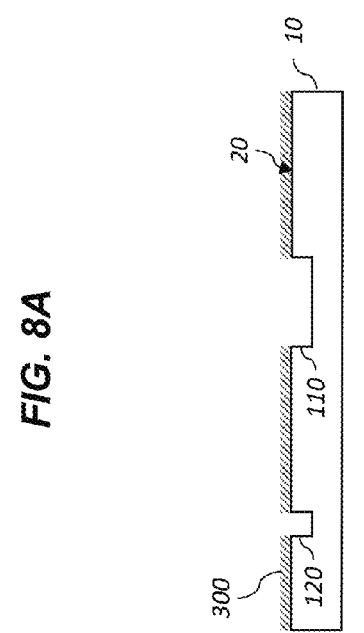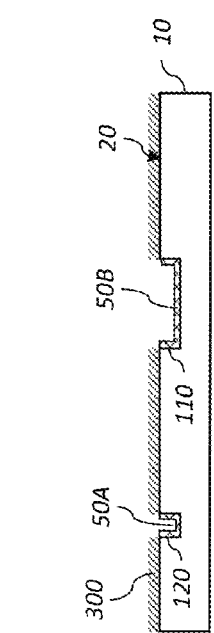

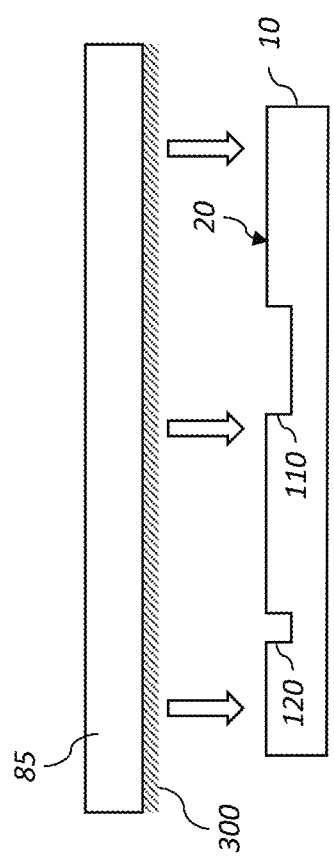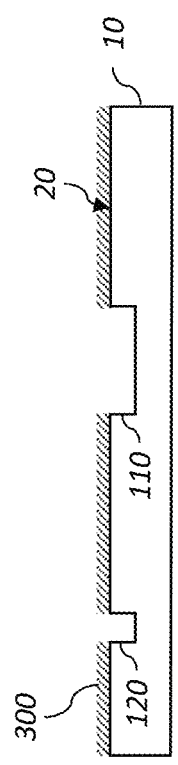

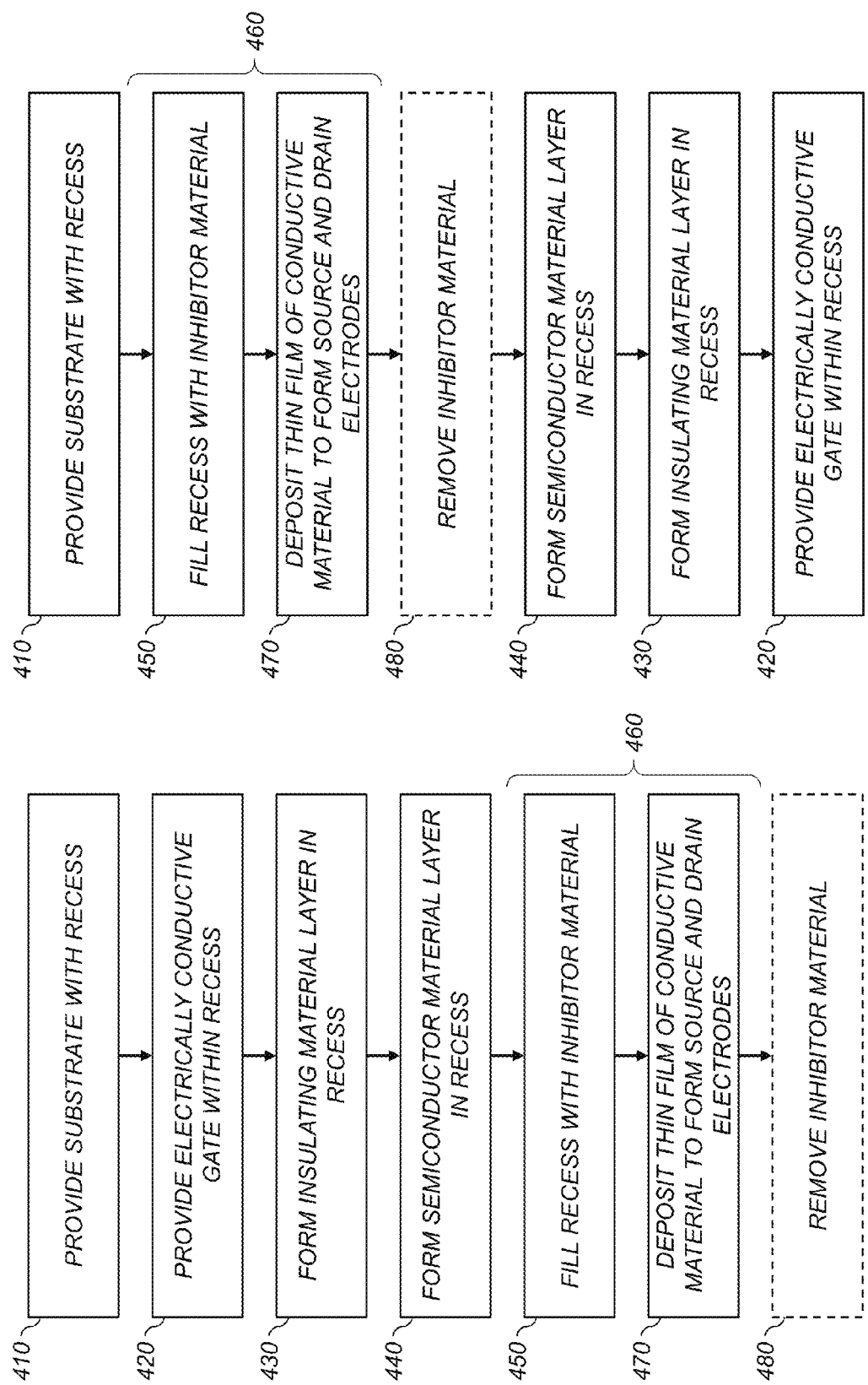

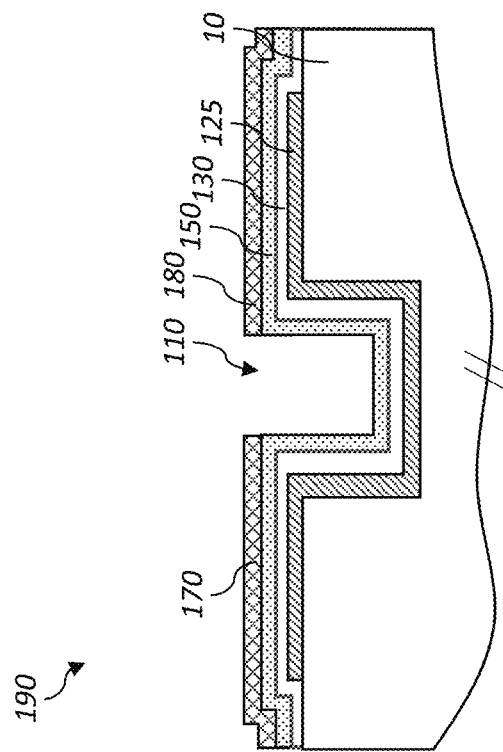
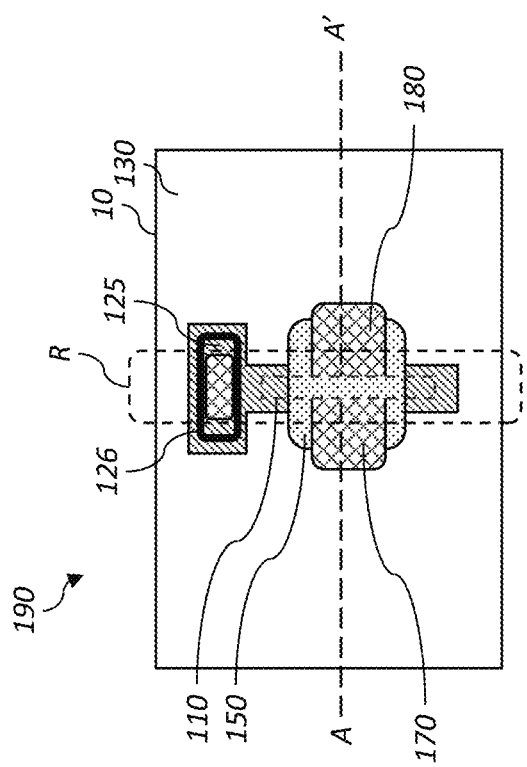
FIG. 11N
FIG. 11M

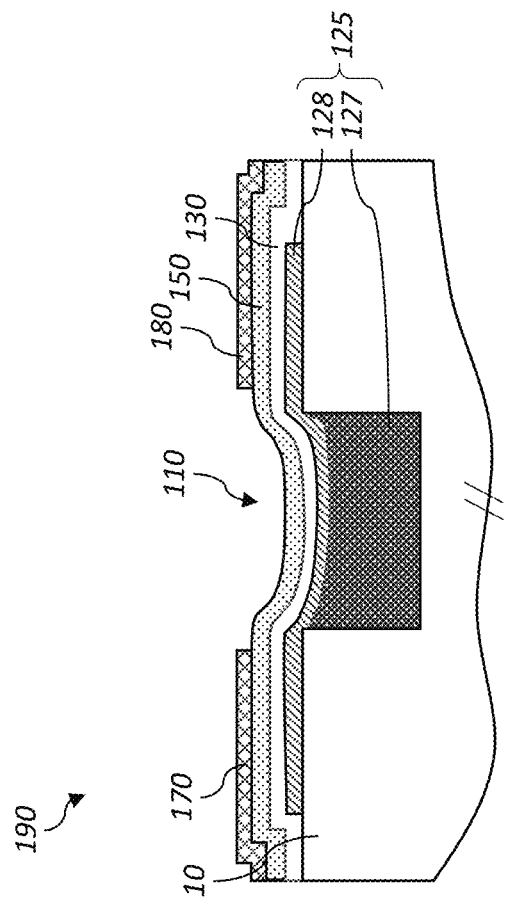
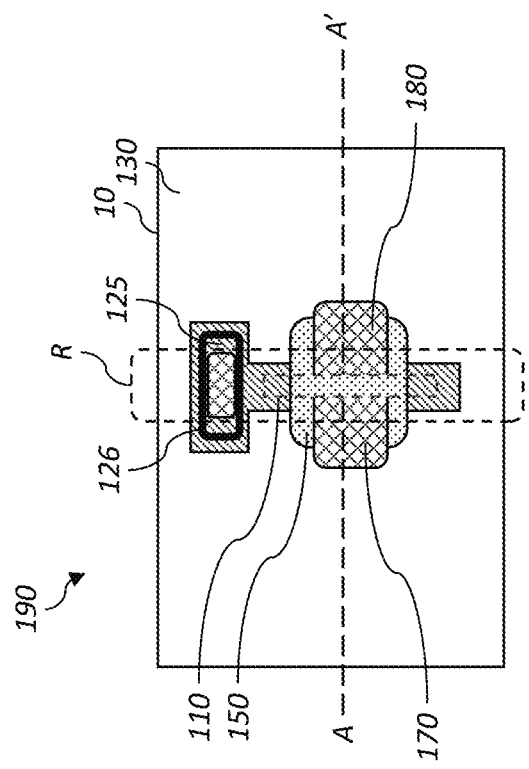
FIG. 12B
FIG. 12A

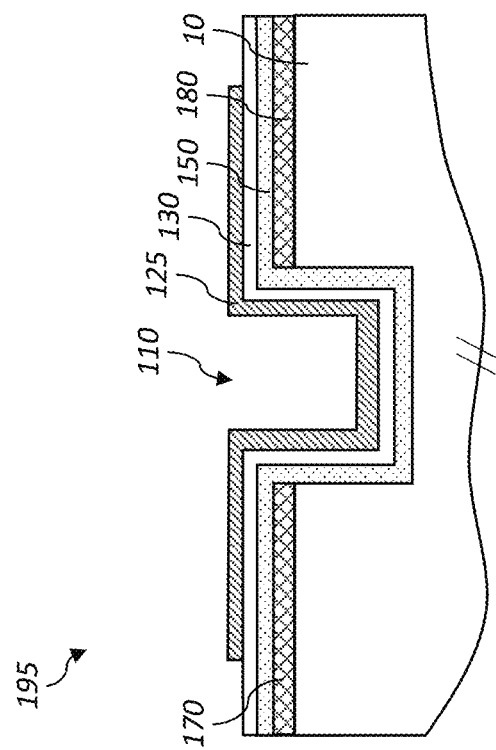
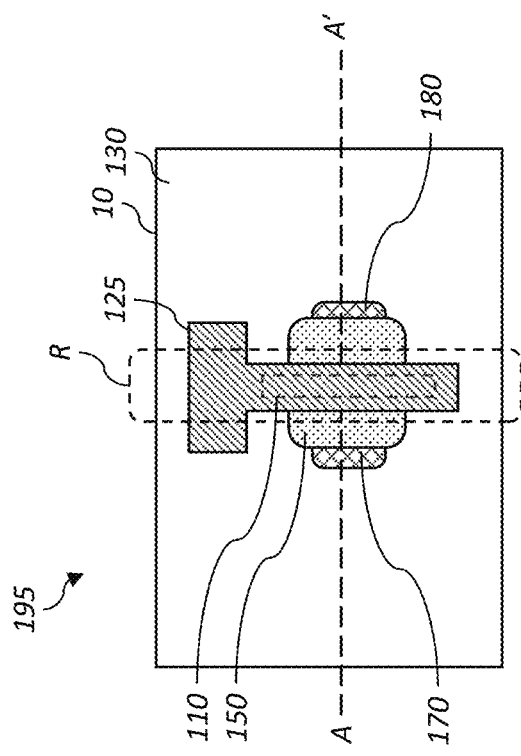
FIG. 13A
FIG. 13B

METHOD FOR FORMING A THIN-FILM TRANSISTOR

CROSS REFERENCE TO RELATED APPLICATIONS

Reference is made to commonly assigned, co-pending U.S. patent application Ser. No. 15/338,543, entitled: "Method for selective deposition using surface topography", by S. Nelson et al.; and to commonly assigned, co-pending U.S. patent application Ser. No. 15/338,561, entitled: "Bottom-gate transistor formed in surface recess", by S. Nelson et al., each of which is incorporated herein by reference.

FIELD OF THE INVENTION

This invention pertains to the field of patterning thin-film materials, and more particularly to using surface topography and selective area deposition for electronic or optical elements.

BACKGROUND OF THE INVENTION

Modern-day electronic and optical systems require multiple patterned layers of electrically or optically active materials, sometimes over a relatively large substrate. Electronics such as radio frequency identification (RFID) tags, photovoltaic components, and optical and chemical sensors all require some level of patterning in their electronic circuitry. Flat panel displays, such as liquid crystal displays or electroluminescent displays rely upon accurately patterned sequential layers to form thin-film components of the backplane. These electronic components include capacitors, transistors, and power buses. The usual combination of photolithographic patterning methods and selective etch processes has several shortcomings including high cost, difficulty with large substrates, and complexity of selective etch processes.

In the semiconductor industry there is much interest in the ability to align a material layer to features formed in the substrate or to underlying layers. Sacrificial filler material has been used to fill vias and other recess topography to prevent deposition within the recesses, and as such to limit deposition only to the top surface of the substrate. Similarly, complicated manufacturing schemes have been employed to pattern materials such that it is only present within the recessed areas on substrates having a surface topography.

There is a growing interest in depositing thin-film semiconductors on plastic or flexible substrates, particularly because these supports are more mechanically robust, lighter weight, and allow more economic manufacturing, for example, by allowing roll-to-roll processing. Plastics, however, typically limit device processing to below 200° C. There are many other issues associated with the use of plastic supports when using traditional photolithography during conventional manufacturing, making it difficult to perform alignments of transistor components across typical substrate widths, which can be up to one meter or more. Traditional photolithographic processes and equipment may be seriously impacted by the substrate's maximum process temperature, solvent resistance, dimensional stability, water, and solvent swelling, which are all key parameters where plastic supports are typically inferior to glass.

There is also a growing interest in printed electronics with solution-processed active components such as conductive inks, insulating materials, and organic semiconductors. However, it can be difficult to print active materials in high resolution patterns with good alignment, as well as with good orthogonality. Solutions to aspects of this problem have been suggested such as printing onto surfaces that are pre-patterned with different surface energies to contain the printed ink (for example, see U.S. Pat. No. 7,571,529 to H. Sirringhaus et al.).

Several approaches involving surface topography to pattern thin-films with solution-processed active components have also been described. In U.S. Pat. No. 7,571,529, Sirringhaus et al. describes a surface covered with a thin conductive layer which is divided by solid state embossing into two distinct electrical regions separated by a trench. The topography is thus introduced after the thin-film deposition. They further describe using the trench, or microgroove, to selectively deposit material in the microgroove by means of fluid flowing by capillary forces. Since the fluid flowing along the groove is the active material, the desired properties of the dried film must be compatible with those required for the fluid to flow along the trench or groove.

Other groups have described alternative uses of substrate topography for electronic device fabrication. In U.S. Patent Application Publication 2010/0301337, Rider et al. describes the benefits of trenches, or channels, aligned to each other in formation, and of different depths, for the formation of electronic devices with self-aligned electrodes. Once again, the surface features are used to direct the flow of a fluid, or several fluids, containing the active materials for the device.

In light of the complicated existing processes there is an ongoing need to provide simple manufacturing solutions to patterning thin-films in relationship to the topography of a substrate. There is also an ongoing need to provide techniques capable of processing small device features for electronic components without requiring high resolution alignment, in particular the ability to pattern features at a higher resolution than that of a given printing method is highly desired. These needs exist for all substrates, however there is an additional need to address the added complications associated with using deformable substrates by developing self-aligned processes.

SUMMARY OF THE INVENTION

The present invention represents a method of forming a thin-film transistor, including:
  providing a substrate having a top surface and a recess in the top surface;
  providing an electrically conductive gate within the recess;
  forming a conformal insulating material layer in the recess;
  forming a conformal semiconductor material layer in the recess and extending over the top surface of the substrate outside of the recess;
  forming source and drain electrodes by:
    adding a deposition inhibitor material on a portion of the substrate including within the recess; and
    depositing a thin-film of electrically conductive material, wherein the deposition inhibitor material inhibits the deposition of the electrically conductive material such that the electrically conductive material is patterned by the deposition inhibitor material during deposition;
    wherein the patterned electrically conductive material provides the source electrode on a first side of the recess and the drain electrode on a second side of the recess.

This invention has the advantage that the source and drain electrodes of the thin-film transistor are self-aligned to the gate, which is in the recess. The patterning of the thin-film conductive material layer of the source and drain electrodes is accomplished easily and additively using the recess and inhibitor material. This self-alignment can be used advantageously to reduce alignment tolerances, or in some architectures to reduce overlap capacitance in the resulting transistors.

It has the additional advantage that the thin-film conductive material for the source and drain can be formed at higher resolution than the method used to deposit the deposition inhibitor material. In this invention, the channel length of the transistor is advantageously controlled by the recess, enabling the fabrication of high-performance thin-film transistors via a simple manufacturing process.

BRIEF DESCRIPTION OF THE DRAWINGS

FIGS. 1A and 1B are flow diagrams describing the steps for making a patterned thin-film using an inhibitor material and substrate topography according to two exemplary embodiments;

FIGS. 3A-3H illustrate the formation of a patterned thin-film using substrate topography and selective area deposition in accordance with the present invention;

FIGS. 8A, 8C and 8E are cross-sectional views corresponding to the plan views of FIGS. 8B, 8D and 8F, respectively;

FIGS. 8B, 8D and 8F illustrate the formation of a patterned thin-film using an embodiment of the method of FIG. 7 in which the inhibitor material is applied using a donor roller;

FIGS. 9A-9B are cross-sectional views illustrating the application of the inhibitor material using a planar donor geometry;

FIGS. 10A and 10B are flow diagrams describing the steps for building thin-film transistors (TFTs) in a recess in accordance with exemplary embodiments of the present invention;

FIGS. 12A and 12B are a plan view and a cross-sectional view, respectively, illustrating a bottom-gate TFT formed using an exemplary embodiment of the present invention in which a conductive gate material partially fills the recess;

FIGS. 13A and 13B are a plan view and a cross-sectional view, respectively, illustrating a top-gate TFT formed using an exemplary embodiment of the present invention;

It is to be understood that the attached drawings are for purposes of illustrating the concepts of the invention and may not be to scale. Identical reference numerals have been used, where possible, to designate identical features that are common to the figures.

DETAILED DESCRIPTION OF THE INVENTION

Figure 2C:
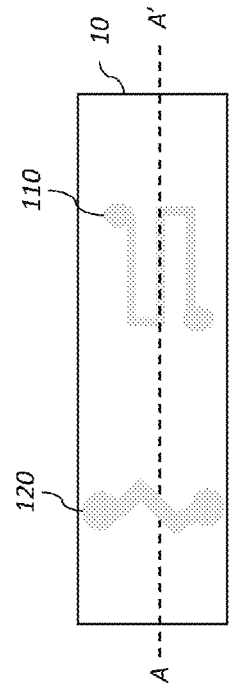
FIGS. 2C-2E are plan views of exemplary patterns of recesses formed in a substrate corresponding to the cross-sectional views of FIGS. 2A-2B.

Throughout the specification and claims, the following terms take the meanings explicitly associated herein, unless the context clearly dictates otherwise. The meaning of "a," "an," and "the" includes plural reference, the meaning of "in" includes "in" and "on." Additionally, directional terms such as "on," "over," "top," "bottom," "left," "right" are used with reference to the orientation of the figure(s) being described. Because components of embodiments of the present invention can be positioned in a number of different orientations, the directional terminology is used for purposes of illustration only and is in no way limiting.

The invention is inclusive of combinations of the embodiments described herein. References to "a particular embodiment" and the like refer to features that are present in at least one embodiment of the invention. Separate references to "an embodiment" or "particular embodiments" or the like do not necessarily refer to the same embodiment or embodiments; however, such embodiments are not mutually exclusive, unless so indicated or as are readily apparent to one of skill in the art. The use of singular or plural in referring to the "method" or "methods" and the like is not limiting. It should be noted that, unless otherwise explicitly noted or required by context, the word "or" is used in this disclosure in a non-exclusive sense.

It is to be understood that elements not specifically shown, labeled, or described can take various forms well known to those skilled in the art. In the following description and drawings, identical reference numerals have been used, where possible, to designate identical elements. It is to be understood that elements and components can be referred to in singular or plural form, as appropriate, without limiting the scope of the invention.

The example embodiments of the present invention are illustrated schematically and are not to scale for the sake of clarity. One of ordinary skill in the art will be able to readily determine the specific size and interconnections of the elements of the example embodiments of the present invention. Therefore, the provided figures are not drawn to scale but are intended to show overall function and the structural arrangement of some embodiments of the present invention.

Even though specific embodiments of the invention have been described herein, it should be noted that the present invention is not limited to these embodiments. In particular, any features described with respect to one embodiment may also be used in other embodiments, where compatible. The features of the different embodiments can be exchanged, where compatible.

The embodiments of the present invention all relate to thin-film inorganic materials and devices that contain them. In preferred embodiments the thin-film inorganic materials are deposited using an atomic layer deposition (ALD) process, more preferably a spatial ALD (SALD) process. For the description that follows, the term "gas" or "gaseous material" is used in a broad sense to encompass any of a range of vaporized or gaseous elements, compounds, or materials. Other terms used herein, such as: reactant, precursor, vacuum, and inert gas, for example, all have their conventional meanings as would be well understood by those skilled in the materials deposition art.

The term "over" refers to the relative position of an element to another and is insensitive to orientation, such that if one element is over another it is still functionally over if the entire stack is flipped upside down. As such, the terms "over", "under", and "on" are functionally equivalent and do not require the elements to be in contact, and additionally do not prohibit the existence of intervening layers within a structure. The term "adjacent" is used herein in a broad sense to mean an element next to or adjoining another element. The figures provided are not drawn to scale but are intended to show overall function and the structural arrangement of some embodiments of the present invention.

Embodiments of the present invention relate to patterning thin-film materials using an inhibitor material applied on substrates having surface topography. The term topography is used herein in its typically understood meaning of a three-dimensional arrangement of physical attributes, such as shape, height, and depth on a surface. In the context of the present invention the physical features that make up the substrate topography of a given area include variations in height. An example of substrate topography are recesses which are below the main plane of the substrate, for example trenches and vias. The term recess is typically used when the majority of the substrate plane is even, and the deviations are recessed. The recesses may have any distance from the substrate surface including variable recess depth. Alternatively, for substrates that predominately have a pattern that rises above the primary substrate plane, the term "mesas" is often used. In all cases, the substrate can be said to have topography with variable height.

The substrate topography of the present invention can be a result of any previous operation on the substrate, including substrate formation. In some embodiments, the topography is a result of previously patterned functional layers. In other embodiments, the topography is formed in the substrate specifically to assist in patterning the thin-film of interest. In yet other embodiments, the topography of the functional layers is the key to aligning the pattern of the thin-film layer to the previously formed functional layers. These embodiments will be described in greater detail in the description that follows.

In embodiments where the topography of the substrate surface is formed to aid in the patterning of the thin-film material, the topography can be formed directly into a substrate by, for example, hot embossing. In some exemplary embodiments, the topography can be formed in a layer of structural polymer over a separate substrate support. The phrase "structural polymer" as used herein refers to the polymeric material used in the formation of the topography, and is additionally useful to distinguish the structural polymer material from other polymeric materials or polymer layers that may be used in the process. The structural polymer is a polymer that is stable in the final application, and a wide variety of structural polymers can be used. Illustrative examples of structural polymers are polyesters, polyetheresters, polyamides, polyesteramides, polyurethanes, polyimides, polyetherimides, polyureas, polyamideimides, polyphenyleneoxides, phenoxy resins, epoxy resins, polyolefins, polyacrylates, polyethylene-co-vinyl alcohols (EVOH), and the like or their combinations and blends. The preferred structural polymers are epoxy resins and polyimides. The structural polymer can be a thermoplastic polymer. The polymer can be a curable composition, including either thermal or radiation curable composition. The polymer does not need to be radiation curable or photosensitive, but photosensitive formulations are useful in the present invention so long as the final cured polymer layer has the structural and mechanical properties required in the final application.

The process of patterning the thin-films of the present invention can be carried out below a support temperature of about 300° C., more preferably below 250° C., or even at temperatures around room temperature (e.g., about 25° C. to 70° C.). These temperatures are well below traditional integrated circuit and semiconductor processing temperatures, and thus enable the use of any of a variety of relatively inexpensive supports, such as flexible polymeric supports. Thus, embodiments of the invention enable production of relatively inexpensive devices on flexible substrates without the need for photolithography and enable rapid pattern changes due to printing the patterns.

The substrates used in the present invention can be any material that acts as a mechanical support for the subsequently coated layers. The substrate can include a rigid material such as glass, silicon, or metals. Useful substrate materials include organic or inorganic materials. Flexible supports or substrates can be used in embodiments of the present invention. Nominally rigid materials that are flexible due to their thinness may also be used. These include glass at thicknesses below 200 μm and metals at thicknesses below 500 μm.

The substrate can be bare indicating that it contains no substantial materials on its surface other the material from which it is composed, and as such the topography can have been previously formed during the formation of the substrate. The substrate can also include various layers on the surface. These layers include subbing layers, adhesion layers, release layers, wetting layers, hydrophilic layers, and hydrophobic layers. The substrate surface can be treated in order to promote various properties. These treatments include plasma treatments, corona discharge treatments, and chemical treatments.

The thin-films of the present invention include those composed of dielectric, semiconductor and conductor materials. In preferred embodiments of the present invention the dielectric, semiconductor and conductor materials are inorganic thin-films. Preferred inorganic thin-film materials include metal oxides. A dielectric material is any material that is a poor conductor of electricity. Such materials typically exhibit a bulk resistivity greater than $10^{10}$ Ω-cm. Examples of dielectrics are $SiO_2$, HfO, ZrO, $Si_xN_y$ and $Al_2O_3$. A semiconductor is a material in which electrical charges can move but in which the concentration of electrical charges can be substantially modulated by external factors such as electrical fields, temperature, or injection of electrical charges from a neighboring material. Examples of semiconductors include silicon, germanium, and gallium arsenide. Particularly preferred semiconductors are zinc oxide-based semiconductors including, zinc oxide, indium zinc oxide, and gallium indium zinc oxide. The semiconductors can be doped to render them n-type or p-type, or to modulate the number of charge carriers present. Conductors of the present invention include metals, such as Al, Ag, Au, Cr, Mo and In, and inorganic conducting oxides, such as indium doped tin oxide (ITO) or aluminum-doped zinc oxide (AZO).

The inorganic thin-film material layers of the present invention are generally conformal, and are preferably deposited using an atomic layer deposition (ALD) process. ALD is a process which is used to produce coatings with thicknesses that can be considered consistent, uniform, or even exact. ALD produces coatings that can be considered conformal or even highly conformal material layers. In temporal vacuum ALD, an ALD process accomplishes substrate coating by alternating between two or more reactive materials, commonly referred to as precursors, in a vacuum chamber. A first precursor is applied to react with the substrate. The excess of the first precursor is removed and a second precursor is then applied to react with the substrate surface. The excess of the second precursor is removed and the process is repeated. In all ALD processes, the substrate is exposed sequentially to a series of reactants that react with the substrate.

Recently, a new ALD process called spatial atomic layer deposition has been developed which negates the need for a vacuum chamber. This process, commonly referred to as S-ALD or SALD, is described in commonly-assigned U.S. Pat. No. 7,413,982, U.S. Pat. No. 7,456,429, U.S. Pat. No. 7,789,961, and U.S. Patent Application Publication 2009/0130858, the disclosures of which are incorporated by reference herein. SALD produces coatings with thicknesses that can be considered consistent, uniform, or even exact. SALD produces coatings that can be considered conformal or even highly conformal material layers. SALD is also compatible with a low temperature coating environment. Additionally, SALD is compatible with web coating, making it attractive for large scale production operations. Even though some web coating operations may experience alignment issues, for example, web tracking or stretching issues, the present invention reduces reliance on high resolution or very fine alignment features during the manufacturing process. As such, SALD is well suited for processes of the present invention.

The preferred process of the present invention employs SALD, a continuous spatially dependent ALD (as opposed to pulsed or time dependent ALD). The process of the present invention allows operation at atmospheric or near-atmospheric pressures and is capable of operating in an unsealed or open-air environment. The process of the present invention is adapted such that material is deposited only in selected areas of a substrate.

The present invention uses selective area deposition (SAD) in combination with ALD. SAD employs an "inhibitor material," which can be referred to as a "deposition inhibitor material," a "deposition inhibitor material," or simply as an "inhibitor." In embodiments of the invention, inhibitor materials inhibit the growth of a thin-film material on the substrate when the substrate is subjected to an atomic layer deposition. The deposition only deposits in regions (selective areas) of the substrate where the inhibitor is not present. The phrase "deposition inhibitor material" and its equivalents refer herein to any material applied on the substrate that inhibits the deposition of material during ALD.

The deposition inhibitor is used in a pattern-wise fashion, in order to impart a pattern to the thin-film at time of deposition. Selective area deposition differs from traditional lift-off processes by preventing any growth on or in the inhibitor material, such that there is no thin-film growth in the area of the inhibitor, either on the substrate or the inhibitor itself. The "deposition inhibitor material" includes the material applied to the substrate as well as the material resulting from any optionally subsequent crosslinking or other reaction that modifies the material that may occur prior to depositing an inorganic thin-film on the substrate by atomic layer deposition. In preferred embodiments, the inhibitor is a polymeric material. A polymeric deposition inhibitor material may be crosslinked after applying the polymer onto the substrate, before or during a patterning step. Similarly, a polymeric inhibitor can be subsequently polymerized, cross-linked, or polymerized and cross-linked after application to the substrate surface.

The deposition inhibiting material preferably includes a polymer. The polymer may be soluble in any convenient solvent and may have any useful molecular weight, preferably in the range of 2,000 to 2,000,000. It may include a single functional group, or may include a plurality of functional groups. In the case of a plurality, the polymer may be a random, periodic, or block polymer. For polymers with chiral centers the polymer may be isotactic, syndiotactic, or atactic. The polymer may have side chains and may be a graft copolymer. The polymer may be linear or branched. The polymer may have low numbers of free acid groups. Preferred polymers that are soluble in non-polar solvents are poly(methyl methacrylate), silicone polymers including poly(dimethyl siloxane), poly(carbonates), poly(sulfones), and poly(esters). Polymers soluble in polar solvents such as water, alcohols, or ketones are particularly preferred for the inhibitor material. Polymers may include amide groups, such as poly(amide), poly(vinyl pyrrolidone), and poly(2-ethyl-oxazoline). Polymers may include ether linkages, such as poly(ethylene glycol). Polymers may include alcohol functionalities, such as poly(vinyl alcohol). Polymers may include neutralized acid groups such as sodium poly(styrene sulfonate) and the sodium salt of poly(acrylic acid). A highly preferred polymer inhibitor is polyvinyl pyrrolidone, due to its solubility in a wide range of solvents.

The addition of the deposition inhibitor material to the substrate surface can be in a patterned manner, such as using inkjet, flexography, gravure printing, micro-contact printing, offset lithography, patch coating, screen printing, or transfer from a donor sheet. In some embodiments, a uniform layer of the deposition inhibitor material can be deposited by flowing, flooding, spraying, rolling or non-impact printing, and then patterned to form a patterned layer of the deposition inhibitor material. The active inhibitor material may be suspended or dissolved in a solvent or vehicle.

In some applications it is desirable to have a polymer dielectric having the same pattern as the polymer inhibitor used to pattern an ALD deposited inorganic thin-film layer. In these applications, the polymer inhibitor is selected to advantageously have inhibitor properties and dielectric properties, as well as mechanical properties such that the polymer is stable in the final structure and application. When the polymer inhibitor is coated with another polymer dielectric layer it may not be necessary to modify the polymer inhibitor surface. In some embodiments, however, the polymer inhibitor is a switchable polymer inhibitor. A switchable polymer inhibitor is a polymer that as deposited, or as patterned, inhibits ALD growth of inorganic thin-films. Upon subjecting the switchable polymer inhibitor to a suitable treatment, the polymer loses its inhibition properties and the ALD is now able to nucleate on the polymer surface. Suitable treatments include high energy oxygen processes, such as oxygen plasmas and UV-ozone treatments. Preferred switchable polymer inhibitors include epoxy resins (such as SU-8), organosiloxanes (such as PDMS), and polyvinyl pyrrolidone (PVP).

In the present invention, the deposition inhibitor material is aligned with the substrate topography in at least some areas of the substrate. Aligned with the topography indicates that the location and pattern of the deposition inhibitor can be described relative to the topographic features. In some embodiments of the present invention, the deposition inhibitor is added into recesses of the substrate topography to prevent the growth of thin-film material inside the recesses.

In some embodiments of the present invention, the deposition inhibitor includes a low-resolution pattern that is independent of the substrate topography and a higher-resolution pattern that is dictated by the substrate topography. The deposition inhibitor can be patterned via exposure (photo-lithographically), or by printing. In some embodiments, the deposition inhibitor is applied via a printing technique having a given printer resolution, and the pattern of the recesses can have a higher resolution (i.e., a smaller feature size) than the printer resolution. In these embodiments, the recesses can interact with the deposition inhibitor material such that the inhibitor material wicks (i.e., moves by capillary action) along the recesses in the substrate surface.

In embodiments where the deposition inhibitor is applied uniformly, it can be removed from the high area of the substrate by using an etch-back or planarization process, leaving the deposition inhibitor in the recesses, or for some substrates, on the substrate surface below the level of the mesas.

In other embodiments, a deposition inhibitor is used on the substrate top surface or mesas of the topography, and the thin-film material is selectively deposited within the recesses. In these embodiments, the deposition inhibitor can be applied using a transfer process such that it is only applied to the top surface of the substrate.

The present invention provides a method for patterning a thin-film using selective area deposition. First, a substrate is provided, the substrate having a top surface and a pattern of recesses in the top surface. Next, an inhibitor material is added into the recesses. Then the thin-film material is deposited onto at least a portion of the top surface of the substrate, with the inhibitor material inhibiting the deposition of the thin-film material within the recesses.

Turning now to the figures, FIG. 1A is a flow diagram for an exemplary embodiment of a process for forming a patterned thin-film inorganic layer using a surface topography and selected area deposition (SAD). In provide substrate with pattern of recesses step 710, a substrate having a top surface including a pattern of recesses is provided into the system. The substrate can be any substrate having appropriate surface topography, and should be understood from the previous description. In add inhibitor material in recesses step 720, a deposition inhibitor material is added in the recesses of the substrate. Adding the deposition inhibitor material to the recesses can include adding the deposition inhibitor only to the recesses, over the entire substrate, or over only a portion of the substrate. The deposition inhibitor material can be added in a pattern-wise fashion, or uniformly. The addition of the deposition inhibitor can be done using any method known in the art including using a coating process, a lamination process, a printing process, or a vapor transfer process to form a self-assembled monolayer (SAM). Depending on the method used to add the deposition inhibitor to the substrate surface, the add inhibitor material in recesses step 720 can include process steps such as drying or crosslinking processes.

Next in deposit thin-film material step 750, an inorganic thin-film material is deposited onto at least a portion of the top surface of the substrate. The thin-film material is patterned during the deposit thin-film material step 750 by the inhibitor material such that the inhibitor material inhibits the deposition of the thin-film material within the recesses, and anywhere else it is present on the substrate surface. As such, the inorganic thin-film layer has the inverse pattern to that of the patterned inhibitor. In an exemplary embodiment, the deposit thin-film material step 750 is performed using an ALD system, more preferably a spatial ALD system. The inorganic thin-film layer can be any material that can be deposited via ALD and whose growth is inhibited by the inhibitor layer.

After deposition of the thin-film layer, the patterned inhibitor material can be removed in some embodiments using an optional remove inhibitor material step 780. For example, a polymer inhibitor material can be removed by a liquid process using a solvent or a detergent. The liquid process can utilize a mechanical action such as brushing or wiping or pressure jets. Polymer inhibitor materials can also be removed by vapor processes. Such processes include exposing the substrate to a vapor reactant that causes removal of the inhibitor material. In some configurations, the removal can happen spontaneously upon reaction with the vapor, resulting in the conversion of the inhibitor to a volatile species. Alternatively, the vapor exposure can react with the inhibitor material converting it to another species or morphology that is then more easily removable with another process, such as a liquid process. The vapor exposure can include applying forms of energy to promote the process. These forms of energy include light exposure, and arcs or plasmas. Particularly desired light exposures include UV exposure, especially in the presence of oxygen to produce ozone. Plasmas include plasmas of various species including oxygen, chlorine, and fluorine. Plasmas created with these materials or with precursors that produce these materials are included within the scope of the present invention.

FIG. 1B is a flow diagram illustrating an exemplary embodiment of the present invention where the addition of the inhibitor material into the recesses includes applying the inhibitor material to the substrate such that it covers at least a portion of the top surface and fills the recesses, and then removing the inhibitor material from the top surface of the substrate while leaving the inhibitor material in at least a portion of the recesses.

In add inhibitor material to surface of substrate step 725, the inhibitor material is applied to the substrate such that it covers at least a portion of the top surface and fills the recesses. In the method of FIG. 1B, the deposition inhibitor material can be added to the substrate without the need for high resolution patterning. The deposition inhibitor material can be any inhibitor material that causes the thin-film material deposition to be inhibited and should be understood from the previous descriptions. In some embodiments, the deposition inhibitor material is chosen specifically for the material to be deposited. In other embodiments, the deposition inhibitor material has a given inhibition power. In some embodiments, the add inhibitor material to surface of substrate step 725 includes uniformly applying the inhibitor over the entire substrate, covering the substrate topography and filling the recesses. This can be done using any method known in the art such as a coating process (e.g., spin coating, curtain coating, blade coating or spray coating), a lamination process, a printing process, or using any other process that coats the substrate surface. In alternative embodiments, the inhibitor material is applied in patches, so that the inhibitor material uniformly covers large areas of the substrate, but not necessarily the entire substrate from edge-to-edge. Depending on the method used to add the inhibitor to the substrate surface, Step 725 can include a drying or cross-linking processes.

In remove inhibitor material not in recesses step 730, the deposition inhibitor material is patterned by removing the inhibitor material from the substrate surface without removing all of the deposition inhibitor from the recesses. In exemplary embodiments this can be done using an etching or planarizing process. The etching can be done using any highly reactive oxygen processes including a UV-ozone process (UVO) or an $O_2$ plasma process. Other etches include plasmas of various species including chlorine, and fluorine. The highly reactive processes can be a batch process using a chamber based tool, or can be a continuous process using web process tools. The highly reactive processes can be at sub-atmospheric (vacuum) pressure or at, near, or above atmospheric pressure. In some exemplary embodiments, the remove inhibitor material not in recesses step 730 includes using mechanical or chemical-mechanical polishing (CMP) to remove the deposition inhibitor material from the primarily planar surface, leaving the deposition inhibitor material only in the recesses.

As discussed earlier with respect to FIG. 1A, in the deposit thin-film material step 750 an inorganic thin-film layer is deposited and patterned by the inhibitor such that the inorganic material only deposits on the areas on the substrate where the inhibitor material is not present.

Figure 2D:
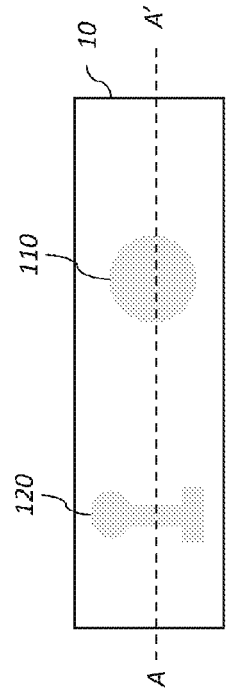
Figure 2E:
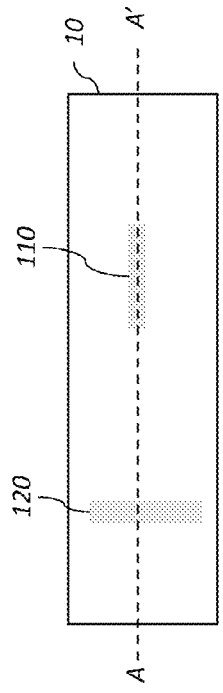
Figure 2A:
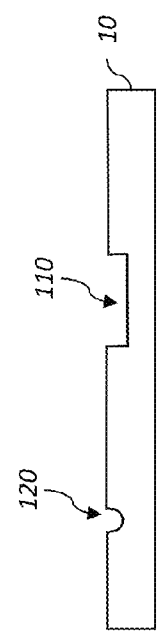
FIGS. 2A-2B are cross-sectional views of exemplary substrates including a surface topography with recesses.
Figure 2B:
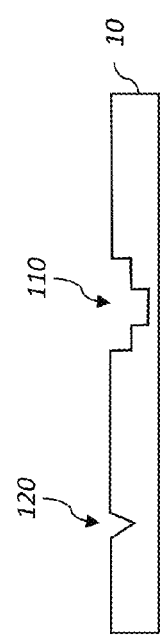

FIGS. 2A and 2B illustrate cross-sections of some example embodiments of a substrate 10 having surface topography including a pattern of recesses. It will be understood to those skilled in the art that the recesses can take a wide variety of shapes, several of which are illustrated in these figures. In FIG. 2A, recess 110 is a flat-bottomed trench, and recess 120 is a round-bottom trenches; and in FIG. 2B, recess 120 is a triangular trench, and recess 110 is a multi-level trench. The cross-sectional views show in FIGS. 2A and 2B can come from a range of different x-y patterns formed on the substrate surface. FIGS. 2C-2E are plan views illustrating exemplary patterns of recesses 110, 120 in the top surface of substrate 10. The cross-sectional views of FIGS. 2A and 2B are exemplary cross-sections for any of the plan views shown in FIGS. 2C-2E taken along the A-A' cross-section line. These example recess geometries are illustrative only, and are not intended to be exhaustive. In the following figures, the recesses are illustrated as square trenches, but it should be understood that other geometries apply equally.

Figure 3B:
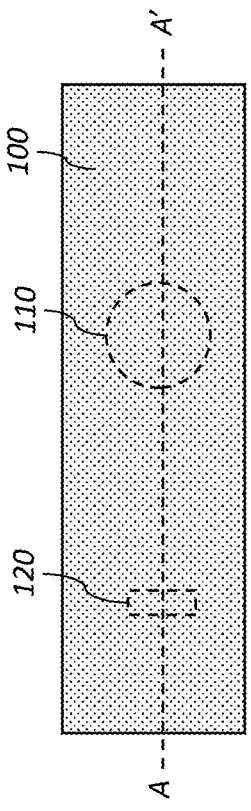
Figure 3D:
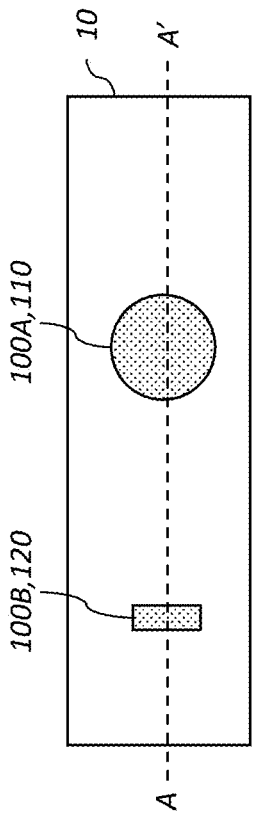
Figure 3A:
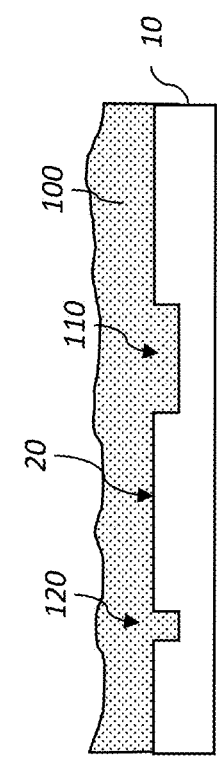

FIGS. 3A-3H illustrate the formation of a patterned thin-film in accordance with an exemplary embodiment of the present invention employing the method of FIG. 1B. FIGS. 3A and 3B illustrate an example cross-sectional view and plan view respectively, after performing the add inhibitor material to surface of substrate step 725. As illustrated, a substrate 10 having a pattern of recesses 110, 120 has been supplied in provide substrate with pattern of recesses step 710, and the deposition inhibitor material 100 has been applied to the substrate 10 using the add inhibitor material to surface of substrate step 725 such that it covers at least a portion of the top surface 20 and fills the recesses 110, 120.

In the plan view FIG. 3B, the shapes of the recesses 110, 120 under the coating of inhibitor material 100 are indicated by dashed outlines.

Figure 3C:
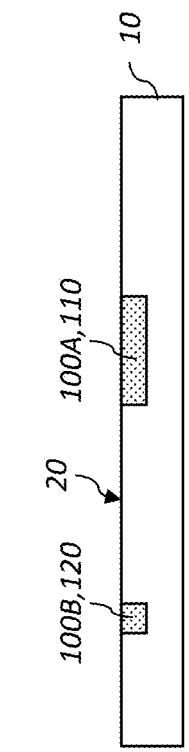

The results of the add inhibitor material to surface of substrate step 725 (FIG. 1B) are illustrated schematically in FIGS. 3C and 3D. The deposition inhibitor material 100A, 100B is now shown in two sections in recesses 110 and 120, respectively. As illustrated, the surface of the inhibitor material 100A, 100B is flat and at the same height as the top surface 20 of the substrate 10. In other embodiments, the surface of the deposition inhibitor material 100A, 100B can be recessed below the top surface 20 of the substrate 10 surface as a result of the removal process, and can be non-planar. In the plan view of FIG. 3D the deposition inhibitor material 100A, 100B can be seen to remain only in the recesses 110, 120.

FIGS. 3E and 3F show the result of depositing a thin-film material 50 using a selective area deposition process in deposit thin-film material step 750 (FIG. 1B). In an exemplary embodiment, the thin-film material 50 is an inorganic thin-film material. The thin-film deposition process of deposit thin-film material step 750 is globally applied over the area of the substrate 10 as shown in FIG. 3F, with the inhibitor material 100A, 100B preventing (i.e., inhibiting) growth on the areas of the substrate 10 where it is present. As such, the layer of thin-film material 50 is patterned to have the inverse pattern of the inhibitor material 100A, 100B as illustrated in cross-sectional view in FIG. 3E. As shown, the thin-film material 50 is on the top surface 20 of the substrate 10, but is not applied over the recesses 110, 120. In the plan view of FIG. 3F, it is clear that the inorganic thin-film layer 50 has the inverse pattern of both the inhibitor material 100A, 100B and the recesses 110, 120.

FIGS. 3G and 3H show the result of optional remove inhibitor material step 780 (FIG. 1B), removing the inhibitor material 100A, 100B shown in FIGS. 3E and 3F has been removed. After removal of the inhibitor material 100A, 100B, the pattern of thin-film material 50 remains on the surface 20 of the substrate 10, but is not present within or over the recesses 110, 120.

Figure 4:
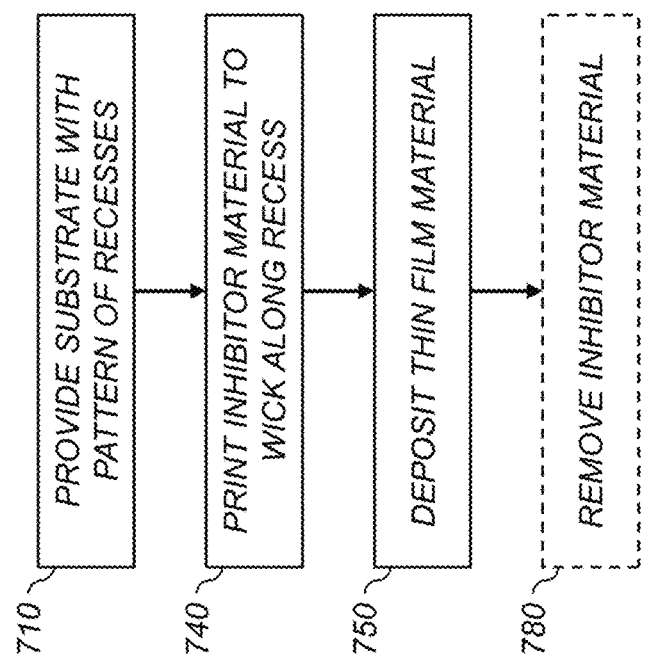
FIG. 4 is a flow diagram describing the steps for making a patterned thin-film using an inhibitor material and substrate topography according to another exemplary embodiment.

FIG. 4 shows a flow diagram for another exemplary embodiment of the present invention for making a patterned thin-film layer using the interaction between a deposition inhibitor material and substrate topography. As discussed earlier in provide substrate with pattern of recesses step 710, a substrate 10 having a top surface 20 and a pattern of recesses 110, 120 is provided into the system. In print inhibitor material to wick along recesses step 740, a deposition inhibitor material 100 is added to the substrate 10 in a patterned manner by a printing process. Typically, an ink is formulated containing the inhibitor material 100 and a solvent or solvents. The ink can be a solution or a dispersion having multiple components, so long as that the material, after drying or other post processing, functions as an inhibitor material 100. Ink formulations which are dried or otherwise converted to the inhibitor material 100 are referred to herein as "inhibitor inks". The print pattern for the inhibitor ink is chosen to supply at least a portion of the recesses with a liquid containing the inhibitor material 100. The relative surface energy of the recesses 110, 120 and thee inhibitor ink results in the inhibitor ink traveling (i.e., "wicking") along the "capillary" defined by the recess by capillary action. The distance that a liquid is moved by capillary action depends on multiple factors, including the chemical nature and wetting properties of the substrate surface, the surface tension and viscosity of the moving liquid, and the drying rate of the liquid.

Conditions and patterns are chosen in the print inhibitor material to wick along recesses step 740 such that the inhibitor ink fills the at least a portion of the recess over a distance sufficient for the given application. In some instances, the pattern of recesses 110, 120 and the corresponding print pattern are co-designed such the recesses 110, 120 are filled with inhibitor material 100 along their entire length. In other embodiments, portions of the recesses 110, 120 may remain free of inhibitor material 100. In some embodiments some or all of the recesses 110, 120 include a reservoir feature to feed the capillary channel, in other embodiments the recesses are simple trenches. In all cases the inhibitor ink wicks along the recesses after application by a printing process. Printing methods include, but are not limited to, inkjet, gravure, flexography and micro-contact printing. The inhibitor ink is then dried (or cured) leaving the inhibitor material 100 in the recess.

Using the method of FIG. 4, a thin-film can be patterned having a spatial resolution that is higher than that of the printing method used to apply the inhibitor ink in print inhibitor material to wick along recesses step 740. Stated differently, the features of the patterned thin-film are smaller than would be allowed by the printing method. In this way, the patterned thin-film has a high resolution that is aligned with the recesses 110, 120. In semiconductor applications this combination of self-aligned and low resolution printing represents an important set of process advantages.

In some embodiments, the printed pattern of inhibitor material 100 can be adjusted by removing a portion of the inhibitor material 100 without removing all of the inhibitor material 100 from the recesses 110, 120 prior to depositing the thin-film material 50. This can be done to clean up the edges of the inhibitor material 100 that extend beyond the edges of the recesses 110, 120 due to the wicking process. In some embodiments an oxygen plasma process can be used.

Continuing with FIG. 4, in deposit thin-film material step 750, a layer of thin-film material 50 is deposited over the surface 20 of the substrate 10. This step is the same as was described in relationship to FIGS. 1A and 1B, and should be understood from the previous description. Similarly, the optional remove inhibitor material step 780 which involves removing the inhibitor material 100 is also the same as was described in relationship to FIGS. 1A and 1B.

Figure 5A:
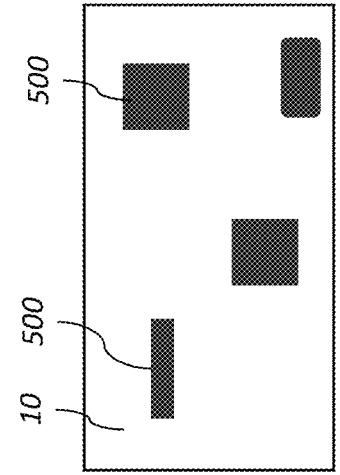
FIGS. 5A-5E are plan views illustrating the application of an inhibitor material using the method of FIG. 4.
Figure 5B:
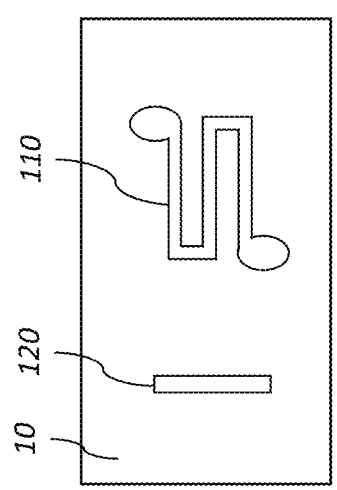
Figure 5C:
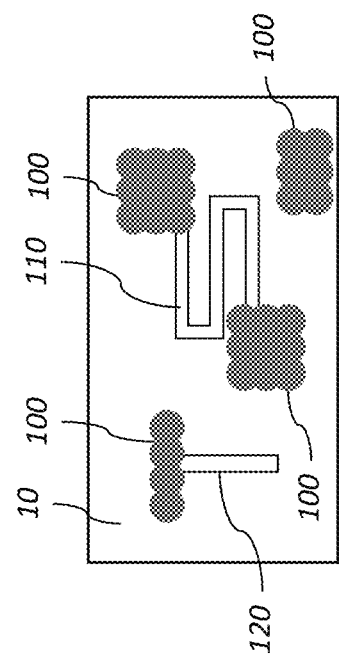

Using ink-jet printing as a representative printing process, the method of FIG. 4 is illustrated in FIGS. 5A-5J. FIGS. 5A-5C serve to further explain the relationship between the pattern of recesses 110, 120 and the pattern of printed inhibitor ink. FIG. 5A shows a pattern of recesses 110, 120. As illustrated in FIG. 5A, recess 110 is a simple trench, and recess 120 includes two reservoir features to feed the capillary channel between them.

FIG. 5B shows a print pattern 500 corresponding to the pattern of inhibitor ink to be printed on the substrate 10. FIG. 5C shows the print pattern 500 overlaid on the pattern of recesses 110, 120 on the substrate 10. As shown, the print pattern 500 crosses the simple trench of recess 110, and fills the reservoir features of recess 120. Additionally, the print pattern 500 includes an area on the substrate surface to pattern the thin-film in an area separate from the recess features.

Figure 5D:
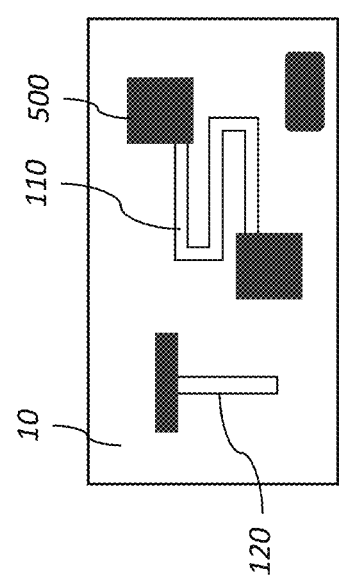
Figure 5E:
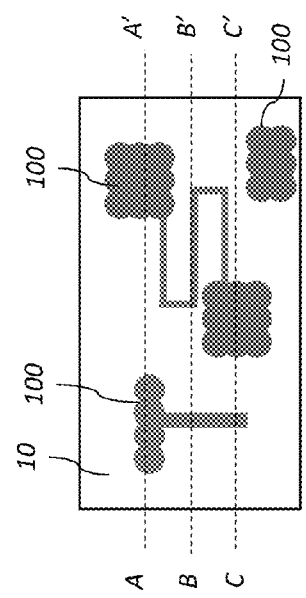

FIG. 5D shows schematically an example placement of individual drops of inhibitor ink using the print pattern 500 of FIG. 5B with an ink jet printer. In this case, the deposition inhibitor material 100 is formulated into a liquid inhibitor ink with appropriate jetting properties. As printed, the drops are slightly larger than the corresponding print pattern but only contact a portion of the recess (corresponding to the area of the print pattern 500). During and after printing the ink interacts with the surface of the substrate 10. FIG. 5E illustrates the substrate 10 after printing, and after the inhibitor ink has interacted with the pattern of recesses 110, 120 (FIG. 5A) and the substrate 10. The result shown can be obtained when the surface of the substrate 10 in the recesses 110, 120 is hydrophilic, and the ink is aqueous based. The relative surface energy of the structure and ink interface results in the ink traveling along the recesses 110, 120 by capillary action.

Figure 5F:
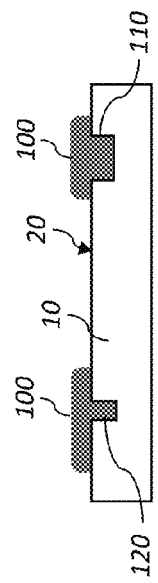
FIGS. 5F-5H are cross-sectional views taken along different cut lines through FIG. 5E.
Figure 5G:
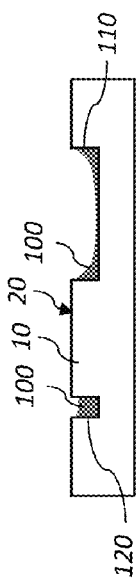
Figure 5H:
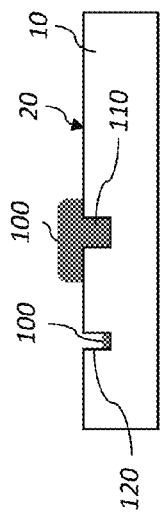

FIGS. 5F, 5G and 5H are cross-sectional views taken along the cross-section lines A-A', B-B' and C-C' of FIG. 5E, respectively. No deposition inhibitor material will be present in the recesses 110, 120 before drops of the inhibitor ink first impinge on the top surface 20 of the substrate 10. However, when the inhibitor ink enters a recess 110, 120, it will be drawn by capillary action along the recess 110, 120. The distance it wicks depends on a variety of physical and chemical characteristics of the recess 110, 120 and of the fluid, including the width and depth of the recess 110, 120, the surface energy and temperature of the top surface and recesses 110, 120 in the surface of the substrate 10, and the viscosity and surface tension of the inhibitor ink containing deposition inhibitor material 100. In FIG. 5E-5G, the spread of the printed inhibitor ink on both on the top surface of the substrate 10 and in the recesses 110, 120 is illustrated. The thickness of the inhibitor material 100 in the recesses 110, 120 will not be constant, but rather will vary from side to middle, and along the length, depending again on many factors. Typically, the inhibitor material 100 can extend above the surface 20 of the substrate 10 in the areas corresponding to the print pattern 500 (FIG. 5C).

Figure 5I:
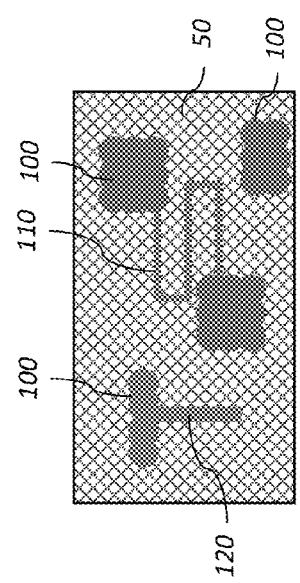
FIGS. 5I-5J are plan views illustrating a patterned thin-film formed using the method of FIG. 4.
Figure 5J:
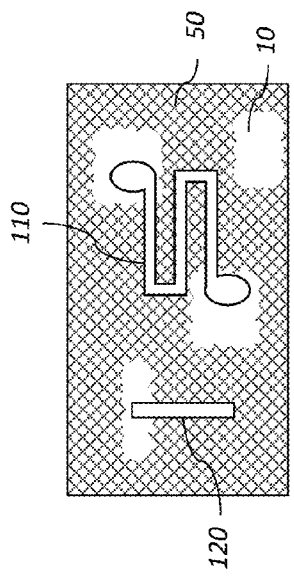

FIG. 5I shows the result of the deposit thin-film material step 750 (FIG. 4), showing the layer of deposited thin-film material 50. It can be seen that the thin-film material 50 has been patterned in the inverse pattern of the inhibitor material 100, both in the areas of the print pattern 500 and in the recesses 110, 120 where the inhibitor ink was wicked using capillary forces. FIG. 5J shows the result of the optional remove inhibitor material step 780 (FIG. 4), where the inhibitor material 100 of FIG. 5I has been removed, leaving the pattern of thin-film material 50.

Figure 6B:
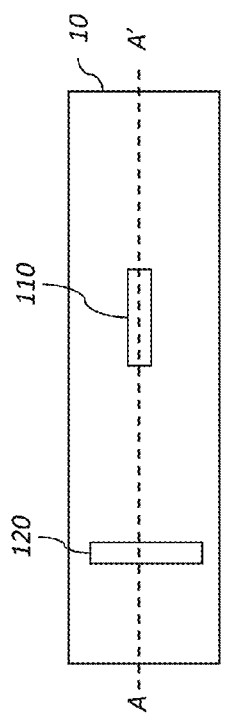
FIGS. 6B, 6D and 6F illustrate the formation of a patterned thin-film in accordance with an exemplary embodiment.
Figure 6D:
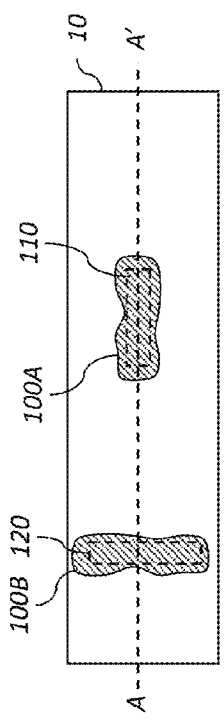
Figure 6F:
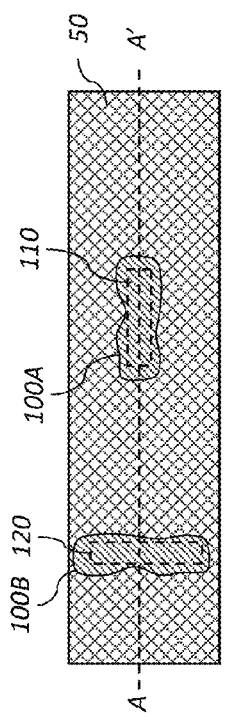
Figure 6A:
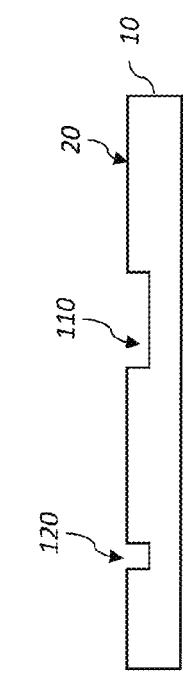
FIGS. 6A, 6C and 6E are cross-sectional views corresponding to the plan views of FIGS. 6B, 6D and 6F, respectively.
Figure 6C:
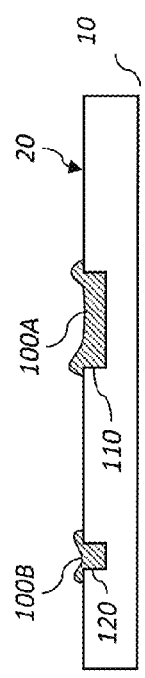
Figure 6E:
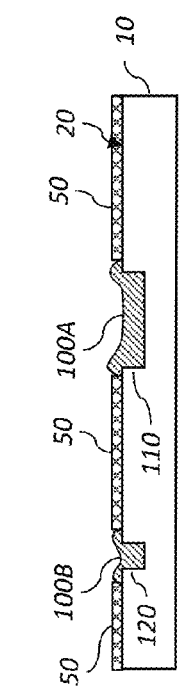

FIGS. 6A-6F illustrate schematically another set of example cross-sectional and plan views for the process described by the flow diagram of FIG. 1A. In this example the deposition of the inhibitor material 100A, 100B is not fully contained within the recesses 110, 120. The recesses 110, 120 in the substrate 10 are illustrated in cross-sectional view in FIG. 6A, and in plan view in FIG. 6B. In FIG. 6C, the cross-sectional view illustrates inhibitor material 100A and 100B located in the recesses 110, 120, respectively, in the substrate 10, but having some extent beyond the edges of the recesses 110, 120. The plan view of FIG. 6D illustrates schematically the way in which the inhibitor ink dries into inhibitor material 100A, 100B that may not have straight edges such as those of the recesses, but can have a pattern characteristic of drops drying on a surface. The selective deposition of an inorganic thin-film material 50 onto the substrate 10, but not onto the regions of inhibitor material 100A or 100B is illustrated in cross-sectional view in FIG. 6E, and in plan view in FIG. 6F. The deposition inhibitor material 100A, 100B may then optionally be removed (not shown.)

Figure 7:
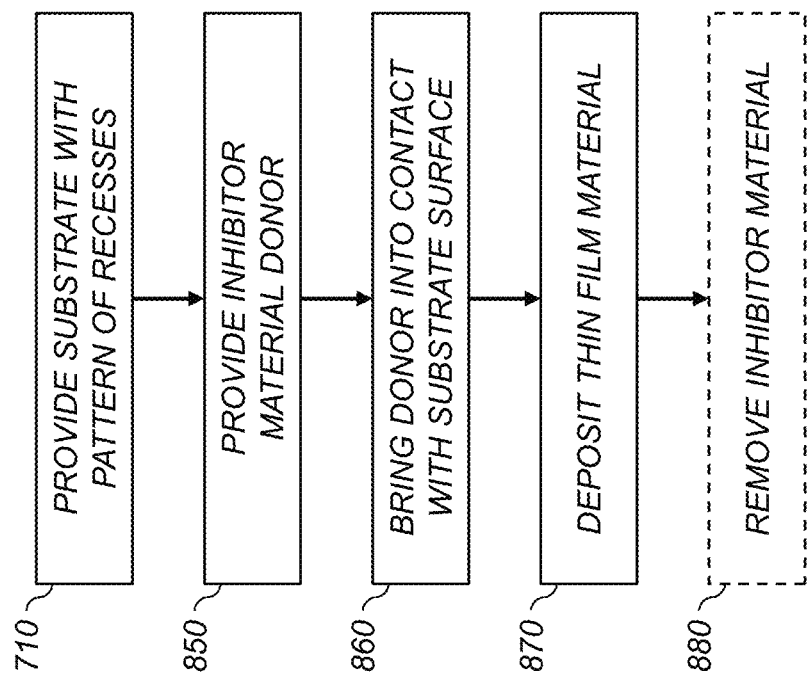
FIG. 7 is a flow diagram describing the steps for making a patterned thin-film using an inhibitor material applied using via a donor to a substrate having a pattern of recesses according to another exemplary embodiment

FIG. 7 shows a flow diagram for another embodiment of the present invention for making a patterned thin-film inorganic layer using substrate topography and selective area deposition. As discussed earlier, in provide substrate with pattern of recesses step 710, a substrate 10 having a surface topography including a pattern of recesses 110, 120 is provided into the system. In provide inhibitor material donor step 850, a donor 80 having a deposition inhibitor material 300 on its surface is provided (see FIG. 8A). A bring donor into contact with substrate surface step 860 is then used to bring the donor into contact with the substrate 10, thereby transferring inhibitor material 300 to the top surface 20 of the substrate 10.

A deposit thin-film material step 870 is then used to perform selective area deposition of a layer of an inorganic thin-film material 50A, 50B on the surface of the substrate 10, such that the deposition only coats the substrate 10 where the deposition inhibitor material 300 is not present, which in this case is only in the recesses 110, 120 of the substrate 10. An optional remove inhibitor material step 880 can then be used to remove the inhibitor material 300 from the substrate 10.

FIGS. 8A-8F illustrate one embodiment of the method of FIG. 7 where the donor 80 is a cylinder with deposition inhibitor material 300 on its surface. The cylinder is rolled along the substrate 10 to transfer at least a portion of deposition inhibitor material 300 to the top surface 20, prominent regions, or mesas of substrate 10. The cylindrical donor 80 does not conform to the recesses 110, 120 in substrate 10, so the recesses 110, 120 (or other low portions of the surface topography) remain substantially uncoated by deposition inhibitor material 300. The bring donor into contact with substrate surface step 860 is illustrated in cross-sectional view in FIG. 8A, and in plan view in FIG. 8B, where the shaded area indicates the deposition inhibitor material 300. The final results of the bring donor into contact with substrate surface step 860 are illustrated in FIGS. 8C and 8D.

The result of depositing the inorganic thin-film material 50A, 50B in deposit thin-film material step 870, is illustrated in the cross-sectional view and plan view of FIGS. 8E and 8F, respectively. As shown, the thin-film material 50A, 50B is deposited only where the inhibitor material 300 is not present, which is in the recesses 110, 120. The deposition inhibitor material 100A, 100B may then optionally be removed (not shown.) using the remove inhibitor material step 880 of FIG. 7.

The donor 80 illustrated in FIGS. 8A-8B was a rolling cylinder, but in other embodiments other donor formats can be used. For example, a pliable flat surface can be used for contact printing the deposition inhibitor material 300 on the top surface 20 of the substrate 10. An example is illustrated in the cross-sectional views of FIGS. 9A and 9B. In this case the donor 85 can be rigid, semi-rigid, or very flexible, as is understood in the art. In FIG. 9A the donor 85, coated with deposition inhibitor material 300 is being brought into contact with portions of the top surface 20 of the substrate 10. When the donor 85 is removed, as illustrated in FIG. 9B, deposition inhibitor material 300 is left on the portion of the surface 20 with which the donor 85 had been in contact, and thus not in the recesses 110, 120. The rest of the process described in FIG. 7 is the same as previously described. In some embodiments, the donor 85 can be smaller than the size of the substrate 10, so as to apply the deposition inhibitor 300 in patches on the top surface 20 of substrate 10.

The figures have illustrated a substrate with surface topography including a pattern of recesses. As previously mentioned, any substrate topography is useful in the present invention that has height variations. Substrates whose topography could be described as having "mesas" are also included in the scope of the present invention. The term recess should not be taken to mean that it covers any particular percentage of the substrate surface only that it is recessed relative to the top-most surface of the substrate 10. As such, a substrate 10 having mesas will still have a pattern of "recesses," the recesses corresponding to the main plane of the substrate 10 at a level below the top surface of the substrate (or recessed relative to the tops of the mesas). It should also be clear that a pattern of recesses can include a single recess.

Many applications require patterned inorganic thin-films and would benefit from the methods of the present invention. Two key advantages of the process of the present invention are 1) self-alignment of the thin-film to the substrate topography or surface features, and 2) the ability to pattern the thin-film at a higher resolution than a particular printing technique. Applications will take advantage of one or both of these advantages. Both optical and electronic elements contain patterned inorganic thin-films, and would benefit from the present process.

The method of the present invention is particularly useful in the field of large area or distributed electronics. In this application space, a recess in a substrate can be used to define the channel of a thin-film transistor (TFT). In such devices, the channel length (i.e., the distance between the source and drain electrodes of the TFT) is determined by the width of the recess. This dimension can be quite small and, as noted earlier, can have smaller dimensions than that achievable by high speed printing techniques. In applications calling for high current and good switching speeds, the distance between source and drain should be as small as possible, with relatively small overlap between gate and source/drain electrodes. FIGS. 10A and 10B are flow diagrams for methods of building TFTs utilizing the process of the present invention. FIG. 10A is specifically for constructing a bottom-gate TFT, while FIG. 10B is for fabricating a top-gate TFT. The steps in FIGS. 10A and 10B are the same; only the order is changed in order to fabricate TFTs with differing architectures.

Starting with FIG. 10A, in order to fabricate a bottom-gate TFT using the method of the present invention, a substrate having at least one recess in the top surface is provided in provide substrate with recess step 410. The recess has an associated width and length. In a preferred embodiment, these dimensions of the recess are chosen both for the desired TFT channel dimensions and to be compatible with for the capillary filling of the recess.

In provide electrically conductive gate within recess step 420, an electrically conductive gate material is provided in the recess. The gate pattern can extend beyond the area of the recess, as long as it is present within the recess. The electrically conductive gate material can be a single material, or a material stack. Importantly, the electrically conductive material in the recess is also recessed from the top surface of the substrate. The electrically conductive gate material can be a conformal material layer that maintains the profile of the recess; examples include transparent conductive oxides deposited by ALD, or preferably SALD. In alternative embodiments, the recess can be filled with a conductive ink that when it dries has preferential shrinkage in the center of the recess in the substrate (concave upwards), thus forming a second recess with a different shape from the original recess in the substrate.

In form insulating material layer in recess step 430, an insulating material layer is formed in the recess. In the method of FIG. 10A, the insulating material is in contact with the conductive gate layer and is the gate dielectric of the bottom-gate TFT formed by the process of the present invention. The insulating material is preferably a conformal insulating material, such as an inorganic thin-film dielectric deposited by ALD, more preferably by SALD. The insulating material can be a single material layer, or a stack of dielectric material layers having the same or different material composition. Conformal inorganic dielectric materials include alumina. An important feature of form insulating material layer in recess step 430 is that a recess from the top surface is maintained, even if a non-conformal dielectric material is used.

Next, in form semiconductor material layer in recess step 440, a semiconductor material is deposited in the recess. In the method of FIG. 10A, the semiconductor is deposited over and in contact with the insulating material layer formed in form insulating material layer in recess step 430. In preferred embodiments, the semiconductor layer is a conformal inorganic semiconductor deposited using an ALD process, more preferably a SALD process. A preferred semiconductor material of the present invention includes ZnO, or Zn containing oxides such as GIZO. An important feature of form semiconductor material layer in recess 440 is that a recess from the top surface is maintained.

After forming the semiconductor layer, a fill recess with inhibitor material step 450 is used to add an inhibitor material to the recess, at least partially filling the recess. Adding the inhibitor material to the recess can be done by any method previously discussed, including printing and filling the recess via capillary action, or by applying uniform coating and removing the inhibitor material from areas of the substrate outside of the recess area. Preferably, the pattern of the inhibitor after the fill recess with inhibitor material step 450 includes the filled recess, as well as areas on the substrate to define the overall area of the source and drain electrodes for the TFT of the present invention.

After adding the inhibitor to the recess, a thin-film of electrically conductive material is coated on the substrate to form the source and drain electrodes in deposit thin-film of conductive material step 470, preferably using an ALD process. The inhibitor on the substrate prevents the thin-film material from depositing on areas of the substrate where it is present, and as such the thin-film material is patterned at the time of deposition by a selective area deposition process. The fill recess with inhibitor material step 450 and the deposit thin-film of conductive material step 470 together provide a form source and drain electrodes process 460. The inhibitor material can optionally be removed from the substrate in remove inhibitor material step 480. The process of removing the inhibitor material can be any process known in the art. In some embodiments, the inhibitor material can be left in place and used as a polymer dielectric material. In alternative embodiments for forming a bottom-gate TFT, the form semiconductor material layer in recess 440 can be performed to deposit the semiconductor after the forming the source and drain electrodes using the form source and drain electrodes process 460.

As noted earlier, the key difference between the process for forming a top-gate TFT shown in FIG. 10B and the process for forming a bottom-gate TFT shown in FIG. 10A is the order of the processing steps. In order to form a top-gate TFT, the source and drain electrodes are formed using the form source and drain electrodes process 460 prior to depositing the gate materials. As shown in FIG. 10B, after the substrate having a recess is provided in provide substrate with recess 410, the recess is filled with inhibitor material in fill recess with inhibitor material step 450, followed by the deposition of the conformal electrically conductive material in deposit thin-film of conductive material step 470 to form the source and drain electrodes. In preferred embodiments, the deposition inhibitor material is removed in remove inhibitor material step 480 prior to depositing the semiconductor material in form semiconductor material layer in recess step 440. In an exemplary configuration, the semiconductor is a conformal semiconductor layer formed in the recess and in contact with the source and drain electrodes.

In alternative embodiments (not shown), the form semiconductor material layer in recess step 440 can be done prior to forming the source and drain electrodes. In these embodiments, the conformal semiconductor layer is deposited after providing the recess and prior to adding the deposition inhibitor. After forming the semiconductor layer, the source and drain electrodes are formed using the form source and drain electrodes process 460 which includes adding the deposition inhibitor material in the recess. In these alternative embodiments the deposition inhibitor material can remain in the final structure as part of the gate dielectric.

After depositing the semiconductor material using the form semiconductor material layer in recess step 440, an insulating material is formed in the recess using the form insulating material layer in recess step 430. As described earlier with respect to FIG. 10A, the insulating material deposited in form insulating material layer in recess step 430 is the gate dielectric of the TFT. The top-gate TFT is completed by adding the electrically conductive gate within the recess in provide electrically conductive gate within recess step 420. The gate is in contact with insulating material.

Figure 11A:
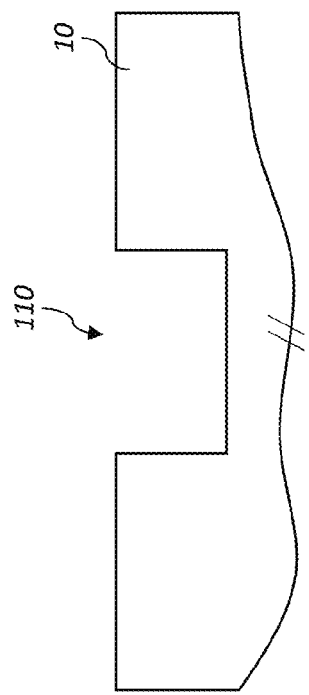
FIGS. 11A-11N illustrate the process of forming a bottom-gate TFT in a recess using an exemplary embodiment of the method of FIG. 10A.
Figure 11B:
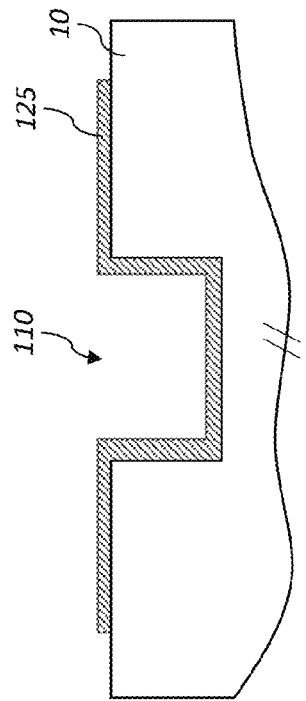

FIGS. 11A-11N illustrate the fabrication of a bottom-gate TFT 190 in accordance with the present invention using the process described in FIG. 10A. In FIGS. 11A and 11B, a substrate 10 with a recess 110 is provided according to provide substrate with recess step 410 of FIG. 10A. FIG. 11B is a cross-sectional view taken along cross-section line A-A' through region R of the plan view of FIG. 11A.

Figure 11C:
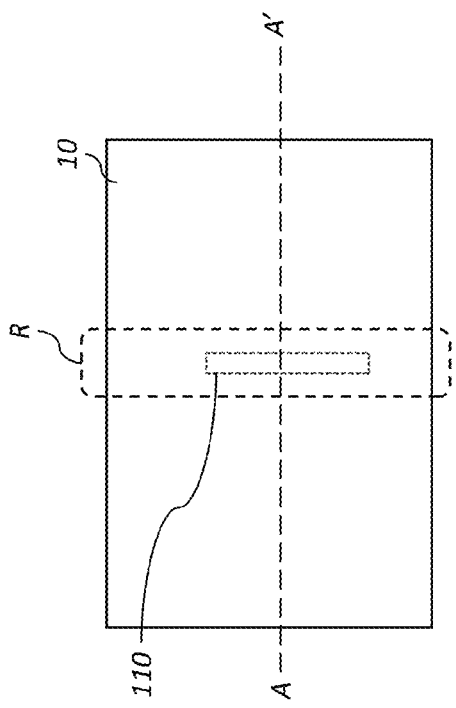
Figure 11D:
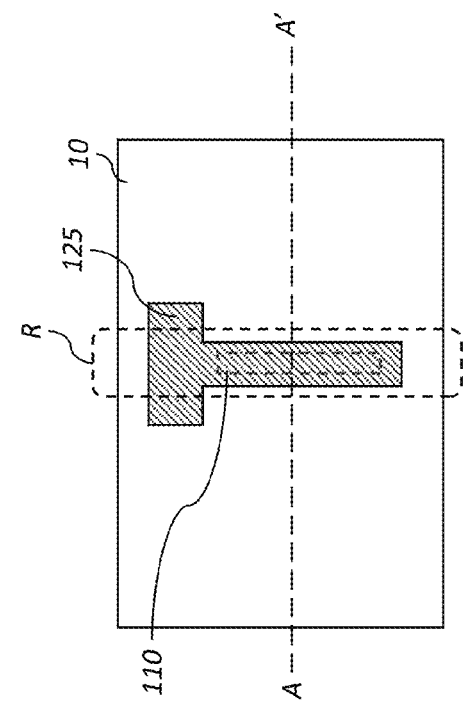

FIGS. 11C and 11D illustrate the results of the provide electrically conductive gate within recess step 420 in which an electrically conductive gate electrode 125 is provided in the recess 110. As shown, the pattern of the gate electrode 125 extends beyond the boundaries of the recess 110 to facilitate making electrical contact to other components in a circuit. In the illustrated configuration, the electrically conductive gate electrode 125 is provided as a conformal material layer. In preferred embodiments the electrically conductive gate electrode 125 is formed using AZO.

Figure 11E:
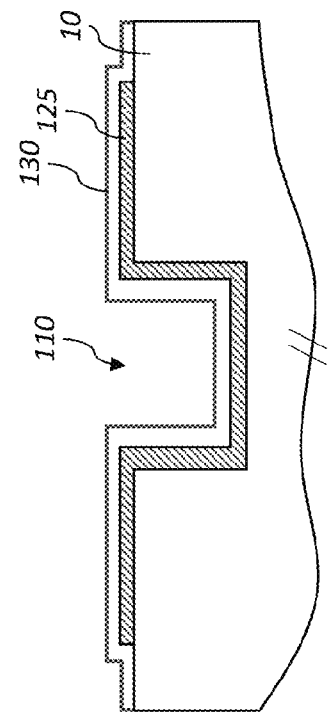
Figure 11F:
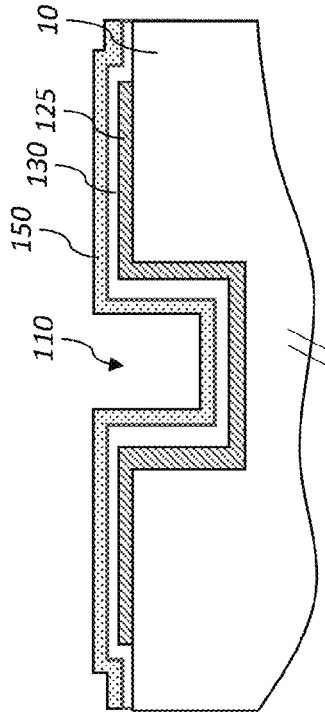

The form insulating material layer in recess step 430 of FIG. 10A calls for forming a conformal insulating material layer 130 (i.e., the gate dielectric) in the recess as shown in the plan view and cross-sectional view of FIGS. 11E and 11F, respectively. The conformal insulating material layer 130 extends beyond the recess, covering much of the electrically conductive gate electrode 125. In the plan view of FIG. 11E, one region of the conductive gate electrode 125 is not covered by the insulating material layer 130, as indicated by region 126. Region 126 provides a via through the insulating material layer 130. In an exemplary embodiment, the region 126 can be achieved by depositing a conformal insulating material layer 130 uniformly, and then etching a hole through the insulating material layer 130, stopping at the conductive gate electrode 125, or preferably by selective area deposition with ALD-deposited dielectric such that no dielectric forms in region 126 during deposition.

Figure 11G:
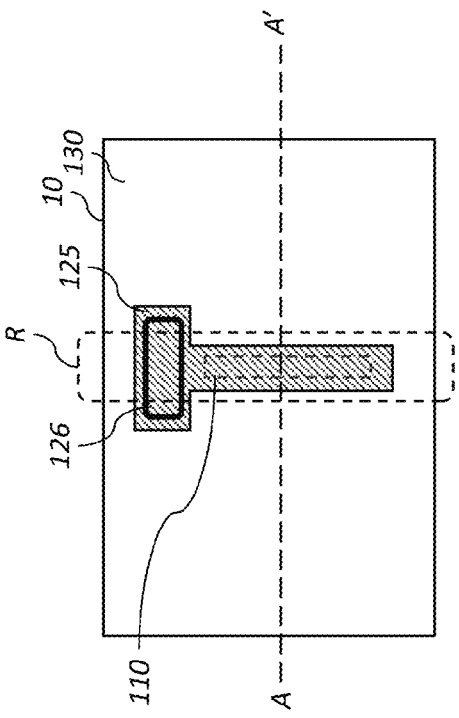
Figure 11H:
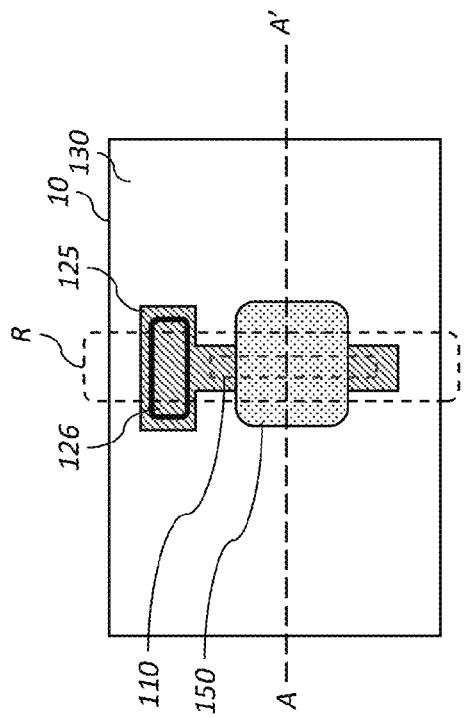

The form semiconductor material layer in recess step 440 is used to provide a conformal semiconductor layer 150 in the recess 110 as illustrated in FIGS. 11G and 11H. The patterning of the semiconductor layer 150, similarly to the patterning of the insulating material layer 130, can either be accomplished by selectively depositing the semiconductor material only in the desired region, or by lithographic patterning after deposition. In either case, the conformal semiconductor layer 150 can be seen in the cross-sectional view of FIG. 11H to follow the shape of the recess 110, and preferably to continue some distance on either side of the recess 110.

Figure 11J:
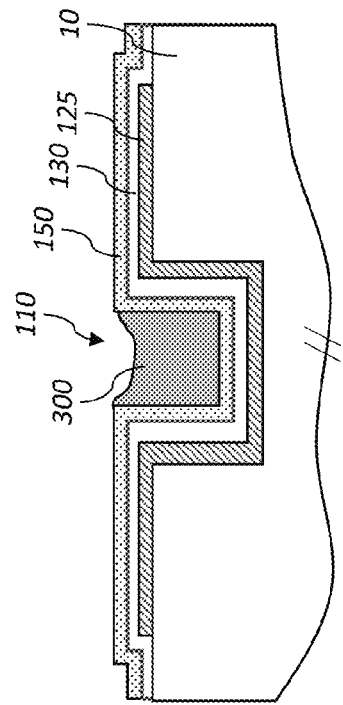
Figure 11L:
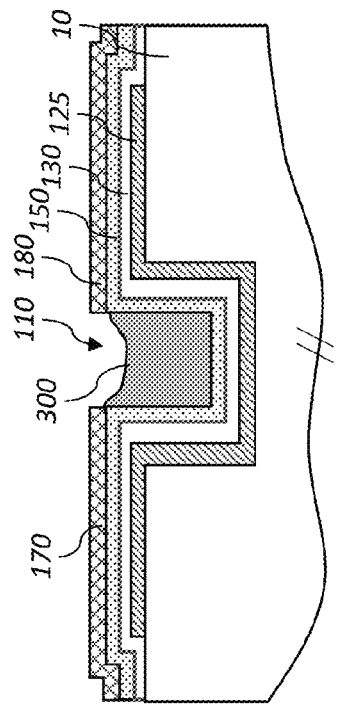
Figure 11I:
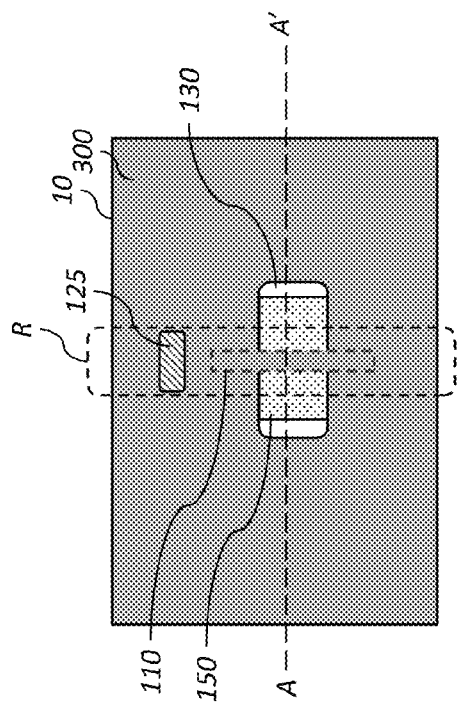
Figure 11K:
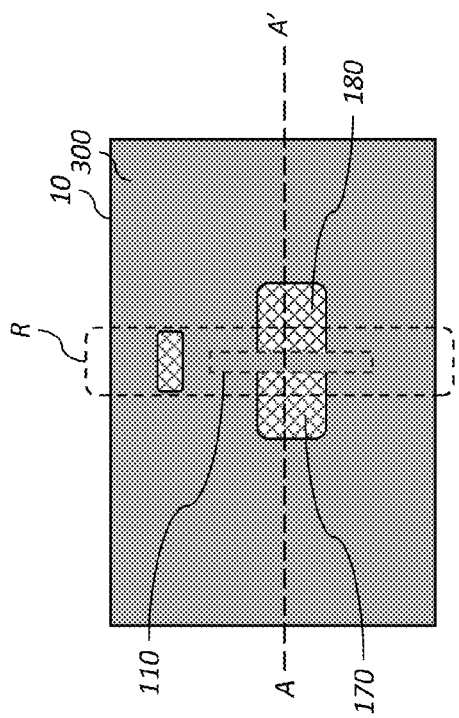

The form source and drain electrodes process 460 (FIG. 10A) is used to form a source electrode 170 and a drain electrode 180 and illustrated in FIGS. 11I-11L. A deposition inhibitor material 300 is first added to the recess using the fill recess with inhibitor material step 450 as shown in FIG. 11I-11J where the deposition inhibitor material (i.e., the shaded region) covers all but three regions of the substrate 10 (regions that will become the source electrode 170, the drain electrode 180, and a gate contact to the gate electrode 125.) In the cross-sectional view of FIG. 11J, the deposition inhibitor material 300 is shown as nearly filling the recess 110. In some embodiments, the deposition inhibitor material 300 may only partially fill the recess 110, or alternatively it may slightly overflow the recess 110, depending on many factors including the fluid volume of inhibitor ink supplied, the surface energies of surface and fluid, the fluid viscosity, and the temperature of the substrate. FIGS. 11K and 11L illustrate the results of the deposit thin-film of conductive material step 470, which involves depositing a thin-film of electrically conductive material over the substrate 10 using a deposition process sensitive to the deposition inhibitor material 300 such that the electrically conductive material deposits only in the regions of the substrate 10 not covered by deposition inhibitor material 300. The source electrode 170 and drain electrode 180 are thus formed, and can be seen in the cross-sectional view of FIG. 11L to form a channel of the TFT whose length is determined by the dimensions of the recess 110.

The last step of FIG. 10A, remove inhibitor material step 480, involves the optional removal of the deposition inhibitor material 300. The resulting bottom-gate TFT 190 is illustrated in the plan view and cross-sectional view of FIGS. 11M and 11N, respectively. The source electrode 170 and drain electrode 180 formed using this process can be considered to be self-aligned to the recess 110 in the substrate 10, and thus can create a bottom-gate TFT 190 with a channel length determined by the dimensions of the recess 110, rather than the print resolution of the patterning step. The amount of overlap between the gate electrode 125 and source and drain electrodes 170, 180, is most easily seen in the cross-sectional view of FIG. 11N where on the flat tops of the source and drain electrodes 170, 180 each run parallel to the flat portion of gate electrode 125. The extent to which the gate electrode 125 extends on the surface outside the recess 110, and the closeness of approach of the source and drain electrodes 170, 180 to the edge of the recess 110, are each parameters that can be chosen by the fabricator. The illustration of FIG. 11N represents one exemplary configuration, but the inventive process allows for minimal overlap of source and drain electrodes 170, 180 with the gate electrode 125.

In an alternative embodiment, the source and drain electrodes 170, 180 can be formed before the conformal semiconductor layer 150 is formed. In this case, the source and drain electrodes 170, 180 will be over the conformal insulating material layer 130 and under the conformal semiconductor layer 150. To accomplish this the form source and drain electrodes process 460 in FIG. 10A is performed before the form semiconductor material layer in recess step 440.

Another embodiment of the process described in FIG. 10A is illustrated in FIGS. 12A and 12B. In the cross-sectional view shown in FIG. 12B, it can be the electrically conductive gate electrode 125 is formed using two conductive layers. The first conductive layer (i.e., non-conformal conductive gate layer 127) can be formed of a conductive silver-containing ink, a conductive polymeric material, or any other conductive material that can partially fill a trench while maintaining a recess in its surface. The second conductive layer (i.e., conformal conductive gate layer 128) is illustrated in this embodiment as a conformally coated conductive layer such as AZO or ITO. However, it could equivalently be a metal or conductive polymeric layer, as long as its top surface contains a recess sufficient to guide fluid along it. The rest of the process to build the bottom-gate TFT 190 of FIGS. 12A and 12B can be understood from the above description of FIG. 10A. In this illustration, the source and drain electrodes are not coincident with the mouth of the original recess in the substrate, but their position and separation are still determined by the combination of fluid properties and substrate topography.

To build a top-gate TFT, as described above in the step diagram of FIG. 10B, very similar processes are used but in a different order. The result of using such a process can be seen in the plan view of a top-gate TFT 195 in FIG. 13A, and the corresponding cross-sectional view of FIG. 13B. The source and drain electrodes 170, 180 are formed first in this embodiment, and are positioned on either side of the recess 110 by means of the form source and drain electrodes process 460 described earlier which involves adding inhibitor material 300 in the recess 110 to provide the gap between them. The semiconductor layer 150, the insulating material layer 130, and the conductive gate electrode 125 are subsequently applied and patterned to form the top-gate TFT 195.

It is instructive to compare this inventive process with prior art TFTs built using topographical features on substrates. In U.S. Pat. No. 7,571,529, Sirringhaus et al. described a method for forming an electronic device including depositing layers of conducting, semiconducting, and/or insulting materials, defining microgrooves in the multilayer structure by solid-state embossing, and forming a switching device inside the microgroove. In this case, the microgroove plays the role of separating the source and drain electrodes, as in the present invention, but it is formed after the deposition of conductive material rather than before. In addition, while the microgroove plays a role in containing fluid in the method of Sirringhaus et al., the fluid is the active conducting material used for the gate, rather than a deposition inhibiting ink.

In U.S. Patent Application Publication 2010/0301337, Rider et al. describe a process using recesses to guide fluid in order to form self-aligned source, drain, and gate electrodes. In this case, again, the fluid that flows in the recesses is anticipated to be an active material (i.e., conductive inks), rather than a deposition inhibiting ink.

An exemplary bottom-gate TFT 190 was fabricated following the process that was laid out in FIG. 10A. A glass substrate 10 was coated with Microchem SU8, diluted 2:1 in PGMEA solvent. Recesses 110 with dimensions of 0.5 mm by 5 µm were formed in the SU8 layer by photolithography.

To perform the provide electrically conductive gate within recess step 420, the substrate 10 was then conformally coated with an inorganic thin-film of aluminum-doped zinc oxide (AZO) to provide the gate electrode 125. The AZO layer was 100 nm thick, and was deposited at 200° C. using the SALD process described in U.S. Pat. No. 7,413,982 and the SALD apparatus described in U.S. Pat. No. 7,456,429 with the organo-metallic precursors diethyl zinc mixed with a low flow rate of dimethyl-aluminum isopropoxide, and water with an inert carrier gas of nitrogen. The AZO is a conductive layer. The AZO layer was patterned by standard photolithography, using Microposit 1813 photoresist and dilute acetic acid as etchant, into rectangles longer than the recess, and approximately 10 times wider so that a rough alignment was sufficient to ensure that AZO remained in the recess 110 and also extended nearly 0.2 mm on either side of the recess 110 in the narrow direction.

To perform the form insulating material layer in recess step 430, the substrate 10 and conductive gate electrode 125 were then conformally coated with a 12 nm thick of aluminum oxide insulating material layer at 200° C. using the SALD process as before, with the organo-metallic precursor trimethyl aluminum, water, and an inert carrier gas of nitrogen to provide the insulating material layer 130.

To perform the form semiconductor material layer in recess step 440, the insulating material layer 130 was then conformally coated with a 12 nm semiconducting material layer of zinc oxide at 200° C. using the precursors diethyl zinc and ammonia gas, and water, with nitrogen as the carrier gas using the SALD process as before to provide the semiconductor layer 150. The zinc oxide semiconductor was patterned by photolithography, using a double layer of PMMA and 1813 photoresists, and dilute acetic acid. A via through the insulating material layer 130 was then patterned, using 1813 photoresist and a warm tetramethyl ammonium hydroxide solution for etching. The resist was then thoroughly stripped.

The substrate was exposed to oxygen plasma, 0.3 T at 100 W for 2 minutes, and a pattern of deposition-inhibitor material, also called inhibitor ink, was applied using a Fuji Dimatix 2500 piezo-inkjet printer to perform the fill recess with inhibitor material step 450. The inhibitor ink was a 2 wt % solution of PVP k-30 in diacetone alcohol, and drop spread on the substrate was approximately 90 µm on flat regions. The pattern printed for each device left one small opening over the gate electrode via, and left a large rectangular opening over the center of the recess 110. Where the pattern of inhibitor ink crossed the recess 110, the fluid was drawn along the recess 110 by capillary forces so that the fluid drawn from one side of the printed rectangle met the fluid drawn from the other. The recess 110, which eventually formed the channel of the bottom-gate TFT 190, was thereby covered by inhibitor material 300 (as shown schematically in FIGS. 11I and 11J.)

Following the patterning of the inhibitor material 300, the substrate was returned to the SALD equipment and 100 nm of AZO was deposited as described above to perform the deposit thin-film of conductive material step 470. Due to the presence of the PVP inhibitor material drawn along the recess 110, the AZO only deposited in regions on either side of the recess 110, and also in a small region over the gate electrode where the PVP was not present. The sample was then subjected to a 2 minute $O_2$ plasma treatment to remove the PVP inhibitor to perform the remove inhibitor material step 480.

Figure 14:
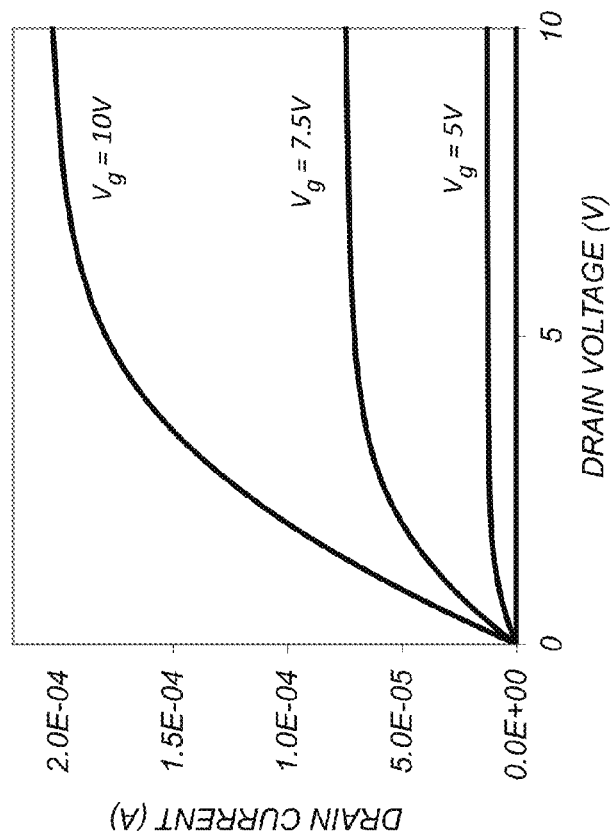
FIG. 14 is a graph showing exemplary drain current vs. drain voltage characteristics for a bottom-gate TFT formed in accordance with the present invention.

Testing of the resulting bottom-gate TFT 190 was accomplished by using a probe station. The conductive gate stack was contacted using the probe station and used to gate the transistors. Referring to FIG. 14, a graph showing drain current ($I_{ds}$) vs. drain voltage ($V_{ds}$) performance characteristics for a bottom-gate TFT 190 of the invention with a channel length of 5 µm and channel width of 200 µm is shown. Curves corresponding to gate voltages of 5 volts, 7.5 volts, and 10 volts are shown. It can be seen that the drain current versus drain voltage characteristics are very responsive to the gate voltage. The electrodes, though deposited in one step, are not connected to each other, but function as distinct source and drain electrodes 170, 180.

Figure 15:
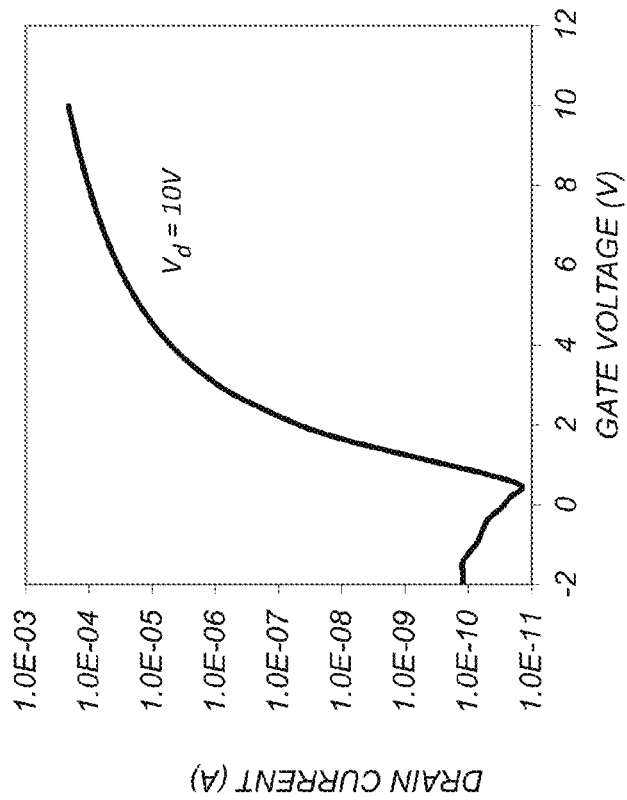
FIG. 15 is a graph showing exemplary drain current vs. gate voltage characteristics for a bottom-gate TFT formed in accordance with the present invention.

Referring to FIG. 15, a graph showing drain current ($I_{ds}$) vs. gate voltage ($V_g$) performance characteristics for 10 V on the drain electrode is shown for the same device. It can be seen that the drain current responds well to the gate voltage, ranging from a small current of about $10^{-11}$ amps at a gate voltage of about 0 volts to greater than $10^{-4}$ amps at a gate voltage of 10 volts.

The invention has been described in detail with particular reference to certain preferred embodiments thereof, but it will be understood that variations and modifications can be effected within the scope of the invention.

PARTS LIST 10 substrate
20 surface
50 thin-film material
50A thin-film material
50B thin-film material
80 donor
85 donor
100 inhibitor material
100A inhibitor material
100B inhibitor material
110 recess
120 recess
125 gate electrode
126 region
127 non-conformal conductive gate layer
128 conformal conductive gate layer
130 insulating material layer
150 semiconductor layer
170 source electrode
180 drain electrode
190 bottom-gate TFT
195 top-gate TFT
300 inhibitor material
410 provide substrate with recess step
420 provide electrically conductive gate within recess step
430 form insulating material layer in recess step
440 form semiconductor material layer in recess step
450 fill recess with inhibitor material step
460 form source and drain electrodes process
470 deposit thin-film of conductive material step
480 remove inhibitor material step
500 print pattern
710 provide substrate with pattern of recesses step
720 add inhibitor material in recesses step
725 add inhibitor material to surface of substrate step
730 remove inhibitor material not in recesses step
740 print inhibitor material to wick along recesses step
750 deposit thin-film material step
780 remove inhibitor material step
850 provide inhibitor material donor step
860 bring donor into contact with substrate surface step
870 deposit thin-film material step
880 remove inhibitor material step
A-A' cross-section line
B-B' cross-section line
C-C' cross-section line
R region

The invention claimed is:

1. A method of forming a thin-film transistor, comprising:
providing a substrate having a top surface and a recess in the top surface;
providing an electrically conductive gate within the recess;
forming a conformal insulating material layer in the recess;
forming a conformal semiconductor material layer in the recess and extending over the top surface of the substrate outside of the recess;
forming source and drain electrodes by:
adding a deposition inhibitor material on a portion of the substrate including within the recess; and
depositing a thin-film of electrically conductive material, wherein the deposition inhibitor material inhibits the deposition of the electrically conductive material such that the electrically conductive material is patterned by the deposition inhibitor material during deposition;
wherein the patterned electrically conductive material provides the source electrode on a first side of the recess and the drain electrode on a second side of the recess.

2. The method of claim 1, wherein the step of forming the source and drain electrodes is performed before the step of forming the conformal semiconductor material layer.

3. The method of claim 1, wherein the step of forming the conformal semiconductor material layer is performed before the step of forming the source and drain electrodes.

4. The method of claim 1, wherein the step of providing the electrically conductive gate is performed before the step of forming a conformal insulating material layer such that the thin-film transistor is a bottom-gate thin-film transistor.

5. The method of claim 1, wherein the step of forming a conformal insulating material layer is performed before the step of providing the electrically conductive gate such that the thin-film transistor is a top-gate thin-film transistor.

6. The method of claim 1, wherein providing the electrically conductive gate includes depositing a conformal thin-film inorganic conductive material.

7. The method of claim 1, wherein providing the electrically conductive gate includes depositing multiple layers of conductive materials.

8. The method of claim 7, wherein the multiple layers of conductive materials include a non-conformal conductive material layer and a conformal thin-film inorganic conductive material layer.

9. The method of claim 1, wherein the step of adding a deposition inhibitor material includes:
applying the deposition inhibitor material to the substrate such that it covers at least a portion of the top surface and fills the recess; and
removing the deposition inhibitor material from a portion of the top surface of the substrate, while leaving the deposition inhibitor material in at least a portion of the recess.

10. The method of claim 9, wherein the deposition inhibitor material is applied using a lamination process, a coating process or a printing process.

11. The method of claim 9, wherein removing the deposition inhibitor material includes using a plasma etching process.

12. The method of claim 1, wherein addition of the deposition inhibitor material into the recesses includes adding a fluid including the deposition inhibitor material within a portion of the recess.

13. The method of claim 12, wherein the fluid is added in a print pattern using a printing process.

14. The method of claim 13, wherein the printing process is an inkjet printing process, a flexography printing process, a gravure printing process or a screen printing process.

15. The method of claim 12, wherein the fluid flows into other portions of the recess by capillary action.

16. The method of claim 1, wherein deposition inhibitor material is also added onto one or more regions of the top surface of the substrate.

17. The method of claim 1, wherein the deposition inhibitor material is a polymeric inhibitor.

18. The method of claim 17, wherein the polymeric inhibitor includes polyvinyl pyrrolidone (PVP) or polymethyl methacrylate (PMMA).

19. The method of claim 1, wherein the thin-film of electrically conductive material is deposited using an atomic layer deposition process.

20. The method of claim 19, wherein the atomic layer deposition process includes using a spatial atomic layer deposition process.

* * * * *